US010403769B2

(12) United States Patent
Muschelknautz et al.

(10) Patent No.: US 10,403,769 B2
(45) Date of Patent: Sep. 3, 2019

(54) ELECTRO-CONDUCTIVE PASTE COMPRISING AG NANO-PARTICLES AND SPHERICAL AG MICRO-PARTICLES IN THE PREPARATION OF ELECTRODES

(71) Applicant: Heraeus Deutschland GmbH & Co. KG, Hanau (DE)

(72) Inventors: Christian Muschelknautz, Darmstadt (DE); Matthias Horteis, Hanau (DE); Isao Tanaka, Ibaraki (JP); Klaus Kunze, Carlsbad, CA (US); Roupen Keusseyan, Carlsbad, CA (US); Toshinori Wada, Ibaraki (JP); Aziz S. Shaikh, San Diego, CA (US)

(73) Assignee: HERAEUS DEUTSCHLAND GMBH & CO. KG, Hanau (DE)

(*) Notice: Subject to any disclaimer, the term of this patent is extended or adjusted under 35 U.S.C. 154(b) by 0 days.

(21) Appl. No.: 14/425,253

(22) PCT Filed: Aug. 30, 2013

(86) PCT No.: PCT/EP2013/002611
§ 371 (c)(1),
(2) Date: Mar. 2, 2015

(87) PCT Pub. No.: WO2014/032808
PCT Pub. Date: Mar. 6, 2014

(65) Prior Publication Data

US 2015/0263192 A1 Sep. 17, 2015

Related U.S. Application Data

(60) Provisional application No. 61/695,579, filed on Aug. 31, 2012.

(51) Int. Cl.

| | |
|---|---|
| ***C09D 5/24*** | (2006.01) |
| ***H01B 1/22*** | (2006.01) |
| ***H01L 31/0224*** | (2006.01) |

(52) U.S. Cl.
CPC ........ *H01L 31/022425* (2013.01); *C09D 5/24* (2013.01); *H01B 1/22* (2013.01); *Y02E 10/50* (2013.01); *Y10T 428/31678* (2015.04)

(58) Field of Classification Search
CPC ..... H01L 31/022425; C09D 5/24; H01B 1/22; Y10T 428/31678; Y02E 10/50
(Continued)

(56) References Cited

U.S. PATENT DOCUMENTS

2013/0277624 A1* 10/2013 Yang .............. H01L 31/022425 252/514
2014/0332067 A1* 11/2014 Graddy, Jr. ............. H01B 1/22 136/256

FOREIGN PATENT DOCUMENTS

CN 101866969 A 10/2010
CN 102368391 A 3/2012
(Continued)

OTHER PUBLICATIONS

Yanhong et al "Hetero-Junction with Intrinsic Thin-Layer Solar Cells", Semiconductor Technology, Jan. 2010, vol. 35, No. 1, pp. 1-7.

*Primary Examiner* — Harold Y Pyon
*Assistant Examiner* — Danny N Kang
(74) *Attorney, Agent, or Firm* — Blank Rome LLP

(57) ABSTRACT

The invention relates to an electro-conductive paste comprising Ag nano-particles and spherical Ag micro-particles in the preparation of electrodes, particularly in electrical devices, particularly in temperature sensitive electrical devices or solar cells, particularly in HIT (Heterojunction with Intrinsic Thin-layer) solar cells. In particular, the invention relates to a paste, a process for preparing a paste, a precursor, a process for preparing an electrical device and a module comprising electrical devices. The invention relates to a paste comprising the following paste constituents:
(Continued)

a. Ag particles,
b. a polymer system;
wherein the Ag particles have a multi-modal distribution of particle diameter with at least a first maximum in the range from about 1 nm to about less than 1 μm and at least a further maximum in the range from about 1 μm to about less than 1 mm;
wherein the difference between the first and the further maximum is at least about 0.3 μm;
wherein at least 50 wt. % of the Ag particles with a diameter in the range from 1 μm to 1 mm are spherical.

21 Claims, 8 Drawing Sheets

(58) Field of Classification Search
USPC .......................................................... 252/500
See application file for complete search history.

(56) References Cited

FOREIGN PATENT DOCUMENTS

| | | | | |
|---|---|---|---|---|
| CN | 102646459 | A | | 8/2012 |
| JP | 2006339057 | A | | 12/2006 |
| JP | 2007018884 | A | | 1/2007 |
| JP | 2007035353 | A | * | 2/2007 |
| JP | 2009104949 | A | | 5/2009 |
| JP | 2010113912 | | | 5/2010 |
| TW | 591095 | B | | 6/2004 |
| TW | I233620 | B | | 6/2005 |
| TW | I329322 | B | | 8/2010 |
| TW | I364042 | B | | 5/2012 |
| TW | 201229160 | A | | 7/2012 |
| WO | WO 03/045584 | A1 | | 6/2003 |
| WO | WO-2011027951 | A1 | | 3/2011 |
| WO | WO 2012/031078 | A1 | | 3/2012 |
| WO | WO 2012/058358 | A1 | | 5/2012 |

* cited by examiner 400
421
420
422
10mm
10mm

ELECTRO-CONDUCTIVE PASTE COMPRISING AG NANO-PARTICLES AND SPHERICAL AG MICRO-PARTICLES IN THE PREPARATION OF ELECTRODES

RELATED APPLICATIONS

This application is a national stage of International Application No. PCT/EP2013/002611 filed Aug. 30, 2013, which claims priority under 35 U.S.C. § 119 to U.S. Provisional Application No. 61/695,579 filed Aug. 31, 2012, the entire disclosures of which are hereby incorporated by reference.

FIELD OF THE INVENTION

The invention relates to an electro-conductive paste comprising Ag nano-particles and spherical Ag micro-particles in the preparation of electrodes, particularly in electrical devices, particularly in temperature sensitive electrical devices or solar cells, particularly in HIT (Heterojunction with Intrinsic Thin-layer) solar cells. In particular, the invention relates to a paste, a process for preparing a paste, a precursor, a process for preparing an electrical device and a module comprising electrical devices.

BACKGROUND OF THE INVENTION

Electrodes are an essential part of a wide range of economically important electrical devices, such as solar cells, display screens, electronic circuitry, or parts thereof. One particularly important such electrical device is the solar cell.

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs. When light hits a solar cell, a fraction of the incident light is reflected by the surface and the remainder transmitted into the solar cell. The transmitted photons are absorbed by the solar cell, which is usually made of a semiconducting material, such as silicon which is often doped appropriately. The absorbed photon energy excites electrons of the semiconducting material, generating electron-hole pairs. These electron-hole pairs are then separated by p-n junctions and collected by conductive electrodes on the solar cell surfaces.

Solar cells are very commonly based on silicon, often in the form of a Si wafer. Here, a p-n junction is commonly prepared either by providing an n-type doped Si substrate and applying a p-type doped layer to one face or by providing a p-type doped Si substrate and applying an n-type doped layer to one face to give in both cases a so called p-n junction. The face with the applied layer of dopant generally acts as the front face of the cell, the opposite side of the Si with the original dopant acting as the back face. Both n-type and p-type solar cells are possible and have been exploited industrially. Cells designed to harness light incident on both faces are also possible, but their use has been less extensively harnessed.

In order to allow incident light on the front face of the solar cell to enter and be absorbed, the front electrode is commonly arranged in two sets of perpendicular lines known as "fingers" and "bus bars" respectively. The fingers form an electrical contact with the front face and bus bars link these fingers to allow charge to be drawn off effectively to the external circuit. It is common for this arrangement of fingers and bus bars to be applied in the form of an electro-conductive paste which is fired to give solid electrode bodies. A back electrode is also often applied in the form of an electro-conductive paste which is then fired to give a solid electrode body.

Another approach to solar cell preparation seeks to provide advantageous cell properties by including amorphous silicon layers. Also known as HIT (Heterojunction with Intrinsic Thin layer) solar cells, such cells can allow reduction of negative effects associated with electron-hole recombination. The amorphous regions in such HIT cells are often temperature sensitive. For further details on HIT-type cells and further applications of low temperature curing pastes used for temperature sensitive devices, please see US 2013/0142963 A1, which is hereby incorporated into this application in its entirety.

There is a need in the state of the art for improved methods for the application of electrodes to substrates, particularly if the substrate is temperature sensitive, as is often the case for HIT solar cells.

SUMMARY OF THE INVENTION

The invention is generally based on the object of overcoming at least one of the problems encountered in the state of the art in relation to electrodes, in particular in relation to electrodes in solar cells or temperature sensitive devices, in particular HIT solar cells.

More specifically, the invention is further based on the object of providing a low temperature process for the preparation of a solar cell which exhibits advantageous cell properties, in particular an advantageously low electrode wafer specific contact resistance, high mechanical stability, continuous electrodes without disruptions or voids, each affecting the conductivity of the electrodes, commonly called cracking, and a high aspect ratio of height to width.

A contribution to achieving at least one of the above described objects is made by the subject matter of the category forming claims of the invention. A further contribution is made by the subject matter of the dependent claims of the invention which represent specific embodiments of the invention.

DETAILED DESCRIPTION

A contribution to achieving at least one of the above described objects is made by a paste comprising the following paste constituents:

a. Ag particles, b. A polymer system;

wherein the Ag particles have a multi-modal distribution of particle diameter with at least a first maximum in the range from about 1 nm to about less than 1 μm and at least a further maximum in the range from about 1 μm to about less than 1 mm;

wherein the difference between the first and the further maximum is at least about 0.3 μm, preferably at least about 0.5 μm, more preferably at least about 1 μm;

wherein at least 50 wt. %, preferably at least about 70 wt. %, more preferably at least about 90 wt. %, of the Ag particles with a diameter in the range from 1 μm to 1 mm are spherical;

In one embodiment of the paste, the Ag particles have a bimodal diameter distribution.

In one embodiment of the paste, the Ag diameter distribution has at least one maximum in the range from about 100 to about 800 nm, preferably in the range from about 150 to about 600 nm, more preferably in the range from about 200 to about 500 nm.

In one embodiment of the paste, the Ag diameter distribution has at least one maximum in the range from about 1 to about 10 μm, preferably in the range from about 1 to about 5 μm, most preferably in the range from about 1 to about 3 μm.

In one embodiment of the paste, the polymer system is a thermosetting system.

In one embodiment of the paste, the thermosetting system comprises a crosslinking compound having at least two unsaturated groups.

In one embodiment of the paste, the thermosetting system comprises a radical generator.

In one embodiment of the paste, the crosslinking compound is present in the range from about 1 to about 10 wt. %, preferably in the range from about 2 to about 9 wt. %, more preferably in the range from about 3 to about 8 wt. %, based on the total weight of the paste.

In one embodiment of the paste, the ratio of the total weight of Ag particles with a diameter in the range from 1 nm to less than 1 μm to the total weight of Ag particles with a diameter in the range from 1 μm to less than 1 mm is in the range from about 1:1 to about 10:1, preferably in the range from about 2:1 to about 8:1, more preferably in the range from about 3:1 to about 6:1.

In one embodiment of the paste, the total weight of Ag particles is in the range from about 60 to about 95 wt. %, preferably in the range from about 70 to about 93 wt. %, more preferably in the range from about 80 to about 90 wt. %, based on the total weight of the paste.

In one embodiment of the paste, the crosslinking compound is based on an acrylate, methacrylate or at least one of them.

In one embodiment of the paste, the crosslinking compound is based on a fatty acid or a derivative thereof.

In one embodiment of the paste, the thermosetting system further comprises a compound having one unsaturated group.

In one embodiment of the paste, the polymer system is a thermoplastic polymer system, wherein the thermoplastic polymer system comprises a thermoplastic polymer.

In one embodiment, the thermoplastic polymer shows at least one, preferably two or more and more preferably all of the following parameters:

a. a glass transition temperature in the range from about −120 to about 110° C., preferably in the range from about −50 to about 100° C. and more preferably in the range from about 20 to 80° C.;
b. a melting temperature being at least about 5° C., preferably at least about 30° C. and most preferred about 50° C. higher than the glass transition temperature; or
c. a number average molecular weight in the range from about 10,000 to about 150,000 g/mol, preferably in the range from about 10,000 to about 100,000 g/mol and more preferably in the range from about 11,000 to about 80,000 g/mol.

In one aspect of this embodiment the combination of the parameters a. and b. is preferred.

In one embodiment of the paste, the thermoplastic polymer is present in the thermoplastic polymer system in an amount in the range from about 5 to about 45 wt. %, preferably in the range from about 10 to about 40 wt. %, more preferably in the range from about 20 to about 30 wt. %, based on the total weight of the thermoplastic polymer system.

In one embodiment of the paste, the thermoplastic polymer is selected from the group consisting of a polyester, an acrylate polymer, a phenoxy polymer, preferable selected from the group consisting of polyester or the acrylate polymer, more preferably polyester.

In one embodiment of the paste, the polyester comprises a polyester backbone.

In one embodiment of the paste, the polymer system comprises a solvent. Organic solvents are preferred according to one aspect of this embodiment.

In one embodiment of the paste, the solvent is an aprotic polar solvent in the thermoplastic polymer system and a protic polar solvent in the thermosetting system.

In one embodiment of the paste, the solvent comprises an acetate moiety.

In one embodiment the paste, the solvent is present in the thermoplastic polymer system in an amount of at least 55 wt. %, preferably at least about 60 wt. %, more preferably at least about 65 wt. %, based on the total weight of the thermoplastic polymer system.

In one embodiment of the paste, the solvent is present in the paste in an amount in the range from about 0.1 to 7 wt. %, preferably in the range from about 0.1 to about 5 wt. %, more preferably in the range from about 0.1 to about 3 wt. %, based on the total weight of the paste.

In one embodiment of the thermosetting system, no more than 65 wt. %, preferably no more than 60 wt. %, more preferably no more than 55 wt. %, each based on the total weight of the thermosetting system, is present in the thermosetting system. In an other aspect of this embodiment it is preferred that the solvent is present in the thermosetting system in an amount ranging from about 40 to about 65 wt. % and preferably ranging from about 45 to about 60 wt. %, each based on the total weight of the thermosetting system. In a further aspect of this embodiment it is preferred that no more than about 10 wt. %, preferably no more than about 5 wt. % and more preferred no more than 1 wt. % of the solvent, each based on the total weight of the thermosetting system, is present in the thermosetting system. These thermosetting systems can be considered as “solvent free”.

In one embodiment of the paste, no more than 1 wt. %, preferably no more than about 0.5 wt. %, more preferably no more than about 0.3 wt. %, based on the total weight of the paste, is present in the thermosetting system paste. In an other aspect of this embodiment it is preferred that the solvent is present in the thermosetting system paste in an amount ranging from about 1 to about 20 wt. % and preferably ranging from about 5 to about 15 wt. %, each based on the total weight of the thermosetting system paste. In a further aspect of this embodiment it is preferred that no more than about 2 wt. %, preferably no more than about 1 wt. % and more preferred no more than 0.5 wt. % of the solvent, each based on the total weight of the thermosetting system paste, is present in the thermosetting system paste. These pastes can be considered as “solvent free”.

In one embodiment of the invention, the paste does not contain more than about 1 wt. %, preferably not more than 0.1 wt. %, more preferably not more than about 0.01 wt. %, glass based on the total weight of the paste. The paste most preferably contains no glass.

A contribution to achieving at least one of the above mentioned objects is made by a process for the preparation of a paste comprising the step of combining the following paste constituents:

a. a first portion of Ag particles with a diameter $d_{50}$ in the range from about 1 nm to about less than 1 μm, preferably in the range from about 100 to about 800 nm, more preferably in the range from about 150 to about 600 nm, most preferably in the range from about 200 to about 500 nm;

b. a further portion of Ag particles has a diameter $d_{50}$ in the range from about 1 μm to about less than 1 mm, preferably in the range from about 1 to about 10 μm, more preferably in the range from about 1 to about 5 μm, most preferably in the range from about 1 to about 3 μm;

c. a polymer system.

The above embodiments relating to preferred features of the paste also apply mutatis mutandis to the paste constituents in the process for the preparation of the paste.

In one embodiment of the process for the preparation of a paste, the ratio of the weight of the first portion to the weight of the further portion is in the range from about 1:1 to about 10:1, preferably in the range from about 2:1 to about 8:1, more preferably in the range from about 3:1 to about 6:1.

In one embodiment of the process according to the invention, the polymer system is a thermosetting system comprising the following constituents:

i. A crosslinking compound having at least two unsaturated groups, ii. A radical generator.

In one embodiment of the process according to the invention, the polymer system is thermoplastic system, comprising the following system constituents:

i. A thermoplastic polymer, ii. A solvent.

A contribution to achieving at least one of the above mentioned objects is made by a paste obtainable by the process according to the invention.

A contribution to achieving at least one of the above mentioned objects is made by a precursor comprising the following precursor parts:

a. a paste according to the invention, b. a substrate.

In one embodiment of the precursor according to the invention, the substrate is temperature sensitive.

In one embodiment of the precursor according to the invention, the substrate is a silicon wafer. In one embodiment of the precursor according to the invention, the substrate comprises a p-n junction.

In one embodiment of the precursor according to the invention, the substrate comprises a first silicon layer, wherein less than 50 wt. %, preferably less than 20 wt. %, more preferably less than 10 wt. %, of the first silicon layer is crystalline. In one aspect of this embodiment, the substrate comprises a further silicon layer, wherein at least 50 wt. %, preferably at least 80 wt. %, more preferably at least 90 wt. %, of the further silicon layer is crystalline. In a further aspect of this embodiment, at least the first silicon layer has a dopant level not above about $1\times10^{16}$ $cm^{-3}$, preferably not above about $10^{14}$ $cm^{-3}$, more preferably not above about $10^{12}$ $cm^{-3}$. Intrinsic (non-doped) layers preferably contain no dopant.

In one embodiment of the precursor according to the invention, the substrate comprises a transparent conductive layer.

In one embodiment of the precursor according to the invention, the transparent conductive layer is selected from the group consisting of the following: a conductive polymer, a conductive oxide.

A contribution to achieving at least one of the above mentioned objects is made by a process for the preparation of a solar cell at least comprising the following steps:

i) provision of a precursor according to the invention;

ii) heating of the precursor to obtain the device.

In one embodiment of the process for the preparation of a device, the heating is carried out at a temperature in the range from about 70 to about 250° C., preferably in the range from about 100 to about 230° C. and more preferably in the range from about 130 to about 210° C.

In one embodiment of the process for the preparation of a device, the device is a solar cell.

A contribution to achieving at least one of the above mentioned objects is made by a device obtainable by the process according to the invention.

A contribution to achieving at least one of the above mentioned objects is made by a device at least comprising as device parts:

i) a substrate;

ii) an electrode;

wherein the metallic particles present in the electrode have a multi-modal diameter distribution with at least a first maximum in the range from about 1 nm to about less than 1 μm and at least a further maximum in the range from about 1 μm to about less than 1 mm;

wherein the first maximum and the further maximum are separated by at least about 0.3 μm;

wherein at least 50 wt. % of the Ag particles with a diameter in the range from 1 μm to less than 1 mm are spherical.

A contribution to achieving at least one of the above mentioned objects is made by a module comprising at least one device according to the invention and at least a further device.

Substrate

Preferred substrates according to the invention are solid articles to which at least one electrode is applied by a process according to the invention. Substrates are well known to the skilled person and he may choose the substrate as appropriate to suit one of a number of applications. The substrate is preferably chosen in order to improve the electrical and/or physical properties of the electrode-substrate contact as necessary for the particular application.

The substrate may comprise a single material or two or more regions of different materials. Preferred substrates which comprise two or more regions of different materials are layer bodies and/or coated bodies.

Preferred substrate materials are semiconductors; organic materials, preferably polymers; inorganic materials, preferably oxides or glasses; metal layers. The substrate material, or materials, may be insulators, preferably glass, polymers or ceramic; semiconductors, preferably a doped group IV or group III/V element/binary compound, or an organic semiconductor; or conductors, preferably a metallised surface or conductive polymer surface; depending on the intended use of the obtained device. The preferred substrates in the context of this invention are wafers, preferably silicon wafers, preferably for the preparation of a solar cell as described in continuation:

For further substrate type which are application in the context of the invention, please refer to US 2013/0142963 A1. Some preferred electrical devices in the context of the invention are RFID (radio frequency identification) devices; photovoltaic devices, in particular solar cells; light-emissive devices, for example, displays, LEDs (light emitting diodes), OLEDs (organic light emitting diodes); smart packaging devices; and touchscreen devices.

Preferred wafers according to the invention are regions, among other regions of the solar cell, capable of absorbing light with high efficiency to yield electron-hole pairs and separating holes and electrons across a boundary with high efficiency, preferably across a so called p-n junction boundary.

It is preferred for the wafer to consist of appropriately doped tetravalent elements, binary compounds, tertiary compounds or alloys. Preferred tetravalent elements in this context are Si, Ge or Sn, preferably Si. Preferred binary compounds are combinations of two or more tetravalent elements, binary compounds of a group III element with a group V element, binary compounds of a group II element with a group VI element or binary compounds of a group IV element with a group VI element. Preferred combinations of tetravalent elements are combinations of two or more elements selected from Si, Ge, Sn or C, preferably SiC. The preferred binary compounds of a group III element with a group V element is GaAs. It is most preferred according to the invention for the wafer to be based on Si. Si, as the most preferred material for the wafer, is referred to explicitly throughout the rest of this application. Sections of the following text in which Si is explicitly mentioned also apply for the other wafer compositions described above.

It is preferred according to the invention for the solar cell to comprise at least one n-type doped layer and at least one p-type doped layer in order to provide a p-n junction boundary.

Doped Si substrates are well known to the person skilled in the art. The doped Si substrate can be prepared in any way known to the person skilled in the art and which he considers to be suitable in the context of the invention. Preferred sources of Si substrates according to the invention are mono-crystalline Si, multi-crystalline Si, amorphous Si and upgraded metallurgical Si, mono-crystalline Si or multi-crystalline Si being most preferred. Doping to form the doped Si substrate can be carried out simultaneously by adding dopant during the preparation of the Si substrate or can be carried out in a subsequent step. Doping subsequent to the preparation of the Si substrate can be carried out for example by gas diffusion epitaxy. Doped Si substrates are also readily commercially available. According to the invention it is one option for the initial doping of the Si substrate to be carried out simultaneously to its formation by adding dopant to the Si mix. According to the invention it is one option for the application of the front doped layer and the highly doped back layer, if present, to be carried out by gas-phase epitaxy. This gas phase epitaxy is preferably carried out at a temperature in a range from about 500° C. to about 900° C., more preferably in a range from about 600° C. to about 800° C. and most preferably in a range from about 650° C. to about 750° C. at a pressure in a range from about 2 kPa to about 100 kPa, preferably in a range from about 10 to about 80 kPa, most preferably in a range from about 30 to about 70 kPa. These temperature conditions usually do not apply to HIT solar cells.

In one embodiment of the invention, the wafer comprises an n-type doped layer and a p-type doped layer and can be used to prepare what is known as an n-type cell (FIG. 1*a*) or a p-type cell (FIG. 1*b*).

In another embodiment of the invention, the wafer comprises one or more amorphous layers. Amorphous layers and intrinsic layers (non-doped layers) are preferably employed in order to reduce the frequency of electron-hole re-combinations and thus improve the electrical properties of the cell. It is preferred for the wafer to comprise at least one, preferably at least two, preferably two, non-doped amorphous layers. It is preferred for the wafer to comprise at least one, preferably at least two, preferably two, doped amorphous layers, preferably at least one n-type doped amorphous layer and at least one p-type doped amorphous layer. Amorphous layers are preferably layers which are less than 50%, preferably less than 20%, more preferably less than 10% crystalline.

A preferred layer structure according to this embodiment is show in FIG. 2.

It is known to the person skilled in the art that Si substrates can exhibit a number of shapes, surface textures and sizes. The shape can be one of a number of different shapes including cuboid, disc, wafer and irregular polyhedron amongst others. The preferred shape according to the invention is wafer shaped where that wafer is a cuboid with two dimensions which are similar, preferably equal and a third dimension which is significantly less than the other two dimensions. Significantly less in this context is preferably at least a factor of about 100 smaller.

A variety of surface types are known to the person skilled in the art. According to the invention Si substrates with rough surfaces are preferred. One way to assess the roughness of the substrate is to evaluate the surface roughness parameter for a sub-surface of the substrate which is small in comparison to the total surface area of the substrate, preferably less than about one hundredth of the total surface area, and which is essentially planar. The value of the surface roughness parameter is given by the ratio of the area of the subsurface to the area of a theoretical surface formed by projecting that subsurface onto the flat plane best fitted to the subsurface by minimising mean square displacement. A higher value of the surface roughness parameter indicates a rougher, more irregular surface and a lower value of the surface roughness parameter indicates a smoother, more even surface. According to the invention, the surface roughness of the Si substrate is preferably modified so as to produce an optimum balance between a number of factors including but not limited to light absorption and adhesion of fingers to the surface.

The two larger dimensions of the Si substrate can be varied to suit the application required of the resultant solar cell. It is preferred according to the invention for the thickness of the Si wafer to lie below about 0.5 mm more preferably below about 0.3 mm and most preferably below about 0.2 mm Some wafers have a minimum size of about 0.01 mm or more.

It is preferred according to the invention for the front doped layer to be thin in comparison to the back doped layer. It is preferred according to the invention for the front doped layer to have a thickness lying in a range from about 0.1 to about 10 μm, preferably in a range from about 0.1 to about 5 μm and most preferably in a range from about 0.1 to about 2 μm.

A highly doped layer can be applied to the back face of the Si substrate between the back doped layer and any further layers. Such a highly doped layer is of the same doping type as the back doped layer and such a layer is commonly denoted with a+($n^+$-type layers are applied to n-type back doped layers and $p^+$-type layers are applied to p-type back doped layers). This highly doped back layer serves to assist metallisation and improve electro-conductive properties at the substrate/electrode interface area. It is preferred according to the invention for the highly doped back layer, if present, to have a thickness in a range from about 1 to about 100 μm, preferably in a range from about 1 to about 50 μm and most preferably in a range from about 1 to about 15 μm.

Dopants

Preferred dopants are those which, when added to the Si wafer, form a p-n junction boundary by introducing electrons or holes into the band structure. It is preferred according to the invention that the identity and concentration of these dopants is specifically selected so as to tune the band structure profile of the p-n junction and set the light absorption and conductivity profiles as required. Preferred p-type dopants according to the invention are those which add holes to the Si wafer band structure. They are well known to the person skilled in the art. All dopants known to the person skilled in the art and which he considers to be suitable in the context of the invention can be employed as p-type dopant. Preferred p-type dopants according to the invention are trivalent elements, particularly those of group 13 of the periodic table. Preferred group 13 elements of the periodic table in this context include but are not limited to B, Al, Ga, In, Tl or a combination of at least two thereof, wherein B is particularly preferred.

Preferred n-type dopants according to the invention are those which add electrons to the Si wafer band structure. They are well known to the person skilled in the art. All dopants known to the person skilled in the art and which he considers to be suitable in the context of the invention can be employed as n-type dopant. Preferred n-type dopants according to the invention are elements of group 15 of the periodic table. Preferred group 15 elements of the periodic table in this context include N, P, As, Sb, Bi or a combination of at least two thereof, wherein P is particularly preferred.

As described above, the various doping levels of the p-n junction can be varied so as to tune the desired properties of the resulting solar cell.

According to the invention, it is preferred for the back doped layer to be lightly doped, preferably with a dopant concentration in a range from about $1\times10^{13}$ to about $1\times10^{18}$ $cm^{-3}$, preferably in a range from about $1\times10^{14}$ to about $1\times10^{17}$ $cm^{-3}$, most preferably in a range from about $5\times10^{15}$ to about $5\times10^{16}$ $cm^{-3}$. Some commercial products have a back doped layer with a dopant concentration of about $1\times10^{16}$.

It is preferred according to the invention for the highly doped back layer (if one is present) to be highly doped, preferably with a concentration in a range from about $1\times10^{17}$ to about $5\times10^{21}$ $cm^{-3}$, more preferably in a range from about $5\times10^{17}$ to about $5\times10^{20}$ $cm^{-3}$, and most preferably in a range from about $1\times10^{18}$ to about $1\times10^{20}$ $cm^{-3}$.

It is preferred for intrinsic (non-doped) layers not to have a dopant level above about $1\times10^{16}$ $cm^{-3}$, preferably not above about $10^{14}$ $cm^{-3}$, more preferably not above about $10^{12}$ $cm^{-3}$. Intrinsic (non-doped) layers preferably contain no dopant.

Electro-Conductive Paste

Preferred electro-conductive pastes according to the invention are pastes which can be applied to a substrate and which, on heating, form solid electrode bodies in physical and/or electrical contact with that substrate. The constituents of the paste and proportions thereof can be selected by the person skilled in the art in order that the paste have the desired properties such as adhesiveness and printability and that the resulting electrode have the desired electrical and physical properties. Metallic particles can be present in the paste, primarily in order that the resulting electrode body be electrically conductive. In order to bring about hardening and adhesion, a thermosetting system can be employed. An example composition of an electrically-conductive paste which is preferred in the context of the invention might comprise:

i) Ag particles, comprising Ag nano-particles and spherical Ag micro-particles, preferably at least about 50 wt. %, more preferably at least about 70 wt. % and most preferably at least about 80 wt. %;

ii) a polymer system iii) additives, preferably in a range from about 0.01 to about 22 wt. %, more preferably in a range from about 0.05 to about 15 wt. % and most preferably in a range from about 0.1 to about 10 wt. %;

wherein the wt. % are each based on the total weight of the electro-conductive paste and add up to 100 wt. %. In one aspect of this embodiment no more than 1 wt. %, preferably no more than 0.5 wt. % and more preferably no additive is present in the paste.

In one embodiment of the invention, the polymer system is a thermosetting system comprising the following constituents:

a. a crosslinking compound, preferably in the range from about 10 to about 99.999 wt. %, more preferably in the range from about 20 to about 99 wt. %, most preferably in the range from about 20 to about 99 wt. %, based on the total weight of the thermosetting system;

b. a radical generator, preferably in the range from about 0.0001 to about 3 wt. %, more preferably in the range from about 0.01 to about 2 wt. %, most preferably in the range from about 0.01 to about 1 wt. %, based on the total weight of the thermosetting system;

c. optionally a solvent, making up the remaining weight of the thermosetting system, 0 wt. % or greater, preferably at least about 20 wt. %, more preferably at least about 30 wt. %, based on the total weight of the thermosetting system;

d. optionally a mono-unsaturated compound, preferably in the range from about 1 to about 10 wt. %, more preferably in the range from about 2 to about 8 wt. %, most preferably in the range from about 4 to about 5 wt. %.

In another embodiment of the invention, the polymer system is a thermoplastic system comprising the following components:

a. a thermoplastic polymer;

b. a solvent.

In order to facilitate printability of the electro-conductive paste, it is preferred according to the invention that the viscosity of the electro-conductive paste lies in a range from about 5 to about 50 Pa·s, preferably in a range from about 10 to about 40 Pa·s.

It is preferred that the paste be cured at low temperatures, preferably below about 250° C., more preferably below about 230° C., most preferably below about 210° C.

In one embodiment, it is therefore preferred that curing, hardening and adhesion functions be facilitated by a polymer system rather than by an inorganic glass or a glass frit. In one embodiment of the invention, the paste does not contain more than about 1 wt. %, preferably not more than about 0.1 wt. %, more preferably not more than about 0.01 wt. % of an inorganic glass or a glass frit. It is preferred for the paste to contain no such glass.

Metallic Particles

Preferred metallic particles in the context of the invention are those which exhibit metallic conductivity or which yield a substance which exhibits metallic conductivity on heating. Metallic particles present in the electro-conductive paste give metallic conductivity to the solid electrode which is formed when the electro-conductive paste is sintered on heating. Metallic particles which favour effective adhesion and yield electrodes with high conductivity and low contact resistance are preferred. Metallic particles are well known to the person skilled in the art. All metallic particles known to the person skilled in the art and which he considers suitable in the context of the invention can be employed as the metallic particles in the electro-conductive paste. Preferred metallic particles according to the invention are metals, alloys, mixtures of at least two metals, mixtures of at least two alloys or mixtures of at least one metal with at least one alloy.

Preferred metals which can be employed as metallic particles according to the invention are Ag, Cu, Al, Zn, Pd, Ni or Pb and mixtures of at least two thereof, preferably Ag. Preferred alloys which can be employed as metallic particles according to the invention are alloys containing at least one metal selected from the list of Ag, Cu, Al, Zn, Ni, W, Pb and Pd or mixtures or two or more of those alloys.

In one embodiment according to the invention, the metallic particles comprise a metal or alloy coated with one or more further different metals or alloys, for example copper coated with silver.

In one embodiment according to the invention, the metallic particles are Ag. In another embodiment according to the invention, the metallic particles comprise a mixture of Ag with Al. As additional constituents of the metallic particles, further to above mentioned constituents, those constituents which contribute to more favourable electrical contact, adhesion and electrical conductivity of the formed electrodes are preferred according to the invention. All additional constituents known to the person skilled in the art and which he considers to be suitable in the context of the invention can be employed in the metallic particles. Those additional substituents which represent complementary dopants for the face to which the electro-conductive paste is applied are preferred according to the invention. When forming an electrode interfacing with an n-type doped Si layer, additives capable of acting as n-type dopant in Si are preferred. Preferred n-type dopants in this context are group 15 elements or compounds which yield such elements on heating. Preferred group 15 elements in this context according to the invention are P and Bi. When forming an electrode interfacing with a p-type doped Si layer, additives capable of acting as p-type dopants in Si are preferred. Preferred p-type dopants are group 13 elements or compounds which yield such elements on heating. Preferred group 13 elements in this context according to the invention are B and Al.

It is well known to the person skilled in the art that metallic particles can exhibit a variety of shapes, surfaces, sizes, surface area to volume ratios, oxygen content and oxide layers. A large number of shapes are known to the person skilled in the art. Some examples are spherical, angular, elongated (rod or needle like) and flat (sheet like). Metallic particles may also be present as a combination of particles of different shapes. Metallic particles with a shape, or combination of shapes, which favours advantageous electrical contact, adhesion and electrical conductivity of the produced electrode are preferred according to the invention. One way to characterise such shapes without considering surface nature is through the parameters length, width and thickness. In the context of the invention the length of a particle is given by the length of the longest spatial displacement vector, both endpoints of which are contained within the particle. The width of a particle is given by the length of the longest spatial displacement vector perpendicular to the length vector defined above both endpoints of which are contained within the particle. The thickness of a particle is given by the length of the longest spatial displacement vector perpendicular to both the length vector and the width vector, both defined above, both endpoints of which are contained within the particle.

Preferred uniform shapes in the context of the invention are spheres. In the following, spherical particles will be used to designate particles with ratios relating the length, the width and the thickness which are close to 1, preferably in the range from about 0.3 to about 3, more preferably in the range from about 0.5 to about 2, most preferably in the range from about 0.8 to about 1.2.

In one embodiment at least 50 wt. %, preferably at least 80 wt. %, more preferably at least about 90 wt. %, of the Ag particles are spherical.

In one embodiment, the Ag micro-particles are spherical: at least 50 wt. %, preferably at least about 80 wt. %, more preferably at least about 90 wt. % of the Ag particles with a diameter in the range from about 1 μm to about less than 1 mm are spherical.

In one embodiment, the Ag nano-particles are spherical: at least 50 wt. %, preferably at least about 80 wt. %, more preferably at least about 90 wt. % of the Ag particles with a diameter in the range from about 1 nm to about less than about 1 μm are spherical.

A variety of surface types are known to the person skilled in the art. Surface types which favour effective sintering and yield advantageous electrical contact and conductivity of produced electrodes are favoured for the surface type of the metallic particles according to the invention.

Another way to characterise the shape and surface of a metallic particle is by its surface area to weight ratio, also known as specific surface area. The specific surface area can be determined using the BET method. The lowest value for the surface area to weight ratio of a particle is embodied by a sphere with a smooth surface. The less uniform and uneven a shape is, the higher its surface area to weight ratio will be. In one embodiment according to the invention, metallic particles with a high specific surface area ratio are preferred, preferably in a range from about 0.1 to about 25 $m^2/g$, more preferably in a range from about 0.5 to about 20 $m^2/g$ and most preferably in a range from about 1 to about 15 $m^2/g$. In another embodiment according to the invention, metallic particles with a low specific surface area are preferred, preferably in a range from about 0.01 to about 10 $m^2/g$, more preferably in a range from about 0.05 to about 5 $m^2/g$ and most preferably in a range about 0.10 to about 1 $m^2/g$.

It is preferred according to the invention that the diameter distribution of the metallic particles be selected so as to reduce the occurrence of areas of low Ag density in the electrode. The person skilled in the art may select the diameter distribution of the metallic particles to optimise advantageous electrical and physical properties of the resultant solar cell. It is preferred according to the invention for the Ag particles to comprise Ag nano-particles and Ag microparticles and thus to exhibit a multimodal diameter distribution.

In one embodiment of the process for the preparation of a paste, the Ag particles are prepared by mixing Ag nanoparticles with Ag micro-particles.

The metallic particles may be present with a surface coating. Any such coating known to the person skilled in the art and which he considers to be suitable in the context of the invention can be employed on the metallic particles. Preferred coatings according to the invention are those coatings which promote improved printing, sintering and etching characteristics of the electro-conductive paste. If such a coating is present, it is preferred according to the invention for that coating to correspond to no more than about 10 wt. %, preferably no more than about 8 wt. %, most preferably no more than about 5 wt. %, in each case based on the total weight of the metallic particles.

In one embodiment according to the invention, the metallic particles are present as a proportion of the electro-conductive paste more than about 50 wt. %, preferably more than about 70 wt. %, most preferably more than about 80 wt. %.

Thermosetting System

In one embodiment of the invention, the polymer system is a thermosetting system.

Preferred thermosetting systems in the context of the invention ensure that the constituents of the electro-conductive paste are present in the form of solutions, emulsions or dispersions and facilitate irreversible hardening or curing to form an electrode. Preferred thermosetting systems are those which provide optimal stability of constituents within the electro-conductive paste and endow the electro-conductive paste with a viscosity allowing effective line printability. Preferred thermosetting systems yield thermosets showing good adhesion on the wafer of the photovoltaic solar cell, are chemically stable under the conditions under which the photovoltaic solar cell is operated in order to guaranty a long operation time of the photovoltaic solar cell, shall not melt at the operation temperatures of the photovoltaic solar cell and should not particular harm the conductivity of the Ag electrode of the photovoltaic solar cell.

Preferred thermosetting systems according to the invention comprise as components:

- a. a crosslinking compound, preferably in the range from about 10 to about 99.999 wt. %, more preferably in the range from about 20 to about 99 wt. %, most preferably in the range from about 20 to about 99 wt. %, based on the total weight of the thermosetting system;
- b. a radical generator, preferably in the range from about 0.0001 to about 3 wt. %, more preferably in the range from about 0.01 to about 2 wt. %, most preferably in the range from about 0.01 to about 1 wt. %, based on the total weight of the thermosetting system;
- c. optionally a solvent, making up the remaining weight of the thermosetting system, 0 wt. % or greater, preferably at least about 20 wt. %, more preferably at least about 30 wt. %, based on the total weight of the thermosetting system;
- d. optionally a mono-unsaturated compound, preferably in the range from about 1 to about 10 wt. %, more preferably in the range from about 2 to about 8 wt. %, most preferably in the range from about 4 to about 5 wt. %;

wherein the wt. % are each based on the total weight of the thermosetting system and add up to 100 wt. %. According to the invention preferred thermosetting systems are those which allow for the preferred high level of printability of the electro-conductive paste described above to be achieved.

The thermosetting system preferably cures irreversibly on heating. It is therefore preferred that the thermosetting system considered as a whole, and preferably also the individual components, especially a and d, exhibit a thermal hysteresis of hardness. In one embodiment the thermosetting system is not a thermoplastic system. In another embodiment, at least one of the constituents a or d, preferably both constituents a and d, is not a thermoplastic.

Crosslinking Compound

Preferred crosslinking compounds in the context of the invention are compounds which contribute to thermosetting behaviour, preferably facilitating irreversible hardening under curing conditions. It is preferred that the crosslinking compound forms interlinked polymeric networks on hardening/curing. Preferred hardening/curing conditions are one or more of the following: presence of a polymerisation initiator, preferably a radical initiator, heating, or electromagnetic radiation.

The crosslinking compound preferably comprises at least two unsaturated double bonds, preferably carbon-carbon double bonds.

Preferred crosslinking compounds can be monomers, oligomers, or polymers. In oligomers or polymers, the unsaturated groups may be present in the main chain or in substituents or branches. Preferred unsaturated groups are alkene groups, vinyl ether groups, ester groups, and alkyne groups, preferably alkenes or alkynes, most preferably alkenes. Preferred esters groups are alkyl or hydroxyl acrylates or methacrylates, preferably methyl-, ethyl-, butyl-, 2-ethylhexyl- or 2-hydroxyethyl-acrylates, isobornylacrylate-, methylmethacrylate-, or ethylmethacrylate-groups. Other preferred ester groups are siliconacrylates. Other preferred mono-unsaturated groups are acrylonitrile-, acrylamide-, methacrylamide groups, N-substituted (methy)acrylamide-, vinyl ester-, such as vinyl acetate-, vinyl ether-, styrene-, alkyl- or halo styrene-, n-vinylpyrrolidone-, vinyl chloride-, or vinylidene chloride-groups.

In one embodiment of the invention, the crosslinking polymer comprises at least one ester group. In one aspect of this embodiment, at least one unsaturated group is present on the acid side of the ester. In another aspect of this embodiment, at least one unsaturated group is present on the alcohol side of the ester. Preferred unsaturated carboxylic acids in this context are acrylic acid, acrylic acid derivatives, preferably methacrylic acid, or unsaturated fatty acids. Preferred unsaturated fatty acids can be mono-unsaturated or multiply unsaturated, preferably Myristoleic acid $CH_3(CH_2)_3CH{=}CH(CH_2)_7COOH$, Palmitoleic acid $CH_3(CH_2)_5CH{=}CH(CH_2)_7COOH$, Sapienic acid $CH_3(CH_2)_8CH{=}CH(CH_2)_4COOH$, Oleic acid $CH_3(CH_2)_7CH{=}CH(CH_2)_7COOH$, Elaidic acid $CH_3(CH_2)_7CH{=}CH(CH_2)_7COOH$, Vaccenic acid $CH_3(CH_2)_5CH{=}CH(CH_2)_9COOH$, Linoleic acid $CH_3(CH_2)_4CH{=}CHCH_2CH{=}CH(CH_2)_7COOH$, Linoelaidic acid $CH_3(CH_2)_4CH{=}CHCH_2CH{=}CH(CH_2)_7COOH$, α-Linolenic acid $CH_3CH_2CH{=}CHCH_2CH{=}CHCH_2CH{=}CH(CH_2)_7COOH$, Arachidonic acid $CH_3(CH_2)_4CH{=}CHCH_2CH{=}CHCH_2CH{=}CHCH_2CH{=}CH(CH_2)_3COOH$, Eicosapentaenoic acid $CH_3CH_2CH{=}CHCH_2\ CH{=}CHCH_2CH{=}CHCH_2CH{=}CHCH_2CH{=}CH(CH_2)_3COOH$, Erucic acid $CH_3(CH_2)_7CH{=}CH(CH_2)_{11}COOH$, or Docosahexaenoic acid $CH_3CH_2CH{=}CHCH_2CH{=}CHCH_2CH{=}CHCH_2CH{=}CHCH_2CH{=}CHCH_2CH{=}CH(CH_2)_2COOH$, or two or more thereof.

Preferred saturated carboxylic acids in this context are fatty acids, preferably $C_9H_{19}COOH$ (capric acid), $C_{17}H_{23}COOH$ (Lauric acid), $C_{13}H_{27}COOH$ (myristic acid) $C_{15}H_{31}COOH$ (palmitic acid), $C_{17}H_{35}COOH$ (stearic acid) or mixtures thereof. Preferred carboxylic acids with unsaturated alkyl chains are $C_{18}H_{34}O_2$ (oleic acid) and $C_{18}H_{32}O_2$ (linoleic acid).

Preferred alcohols in this context may be mono alcohols, diols, or poly-alcohols, preferably sugars. Preferred alcohols are cellulose, glycols, and glycerol.

In one embodiment, the crosslinking compound is formed of a polymer chain with substituents, preferably joined to the chain by an ester group. Preferred polymer backbones are poly acrylates, polyurethanes, polystyrenes, polyesters, polyamides and sugars. The preferred substituents are unsaturated fatty acids and acrylates.

Mono-Unsaturated Compound

Preferred mono-unsaturated compounds in the context of the invention are incorporated into the thermoset network on curing. The mono-unsaturated compound preferably decreases the density of the thermoset network. The skilled person is aware of the use of mono-unsaturated compounds in a thermosetting system for tuning the properties thereof to the desired application and in order to tune properties such as rate of hardening, conditions required for hardening and density of the thermoset resulting from hardening. Preferred mono-unsaturated compounds are esters, vinyl ethers, amides and vinyl compounds, preferably esters. Preferred esters are alkyl or hydroxyl acrylates or methacrylates, preferably methyl-, ethyl-, butyl-, 2-ethylhexylor 2-hydroxyethyl-acrylate, isobornylacrylate, methylmethacrylate, or ethylmethacrylate. Other preferred esters are siliconacrylates. Other preferred mono-unsaturated compounds are acrylonitrile, acrylamide, methacrylamide, N-substituted (methy)acrylamide, vinyl ester, such as vinyl acetate, vinyl ether, such as isobutyl vinyl ether, styrene, alkyl or halo styrenes, n-vinylpyrrolidone, vinyl chloride, or vinylidene chloride.

Solvent in the Thermosetting System

Preferred solvents in the thermosetting system are constituents of the thermosetting system which are removed to a significant extent during heating, preferably those which are present after heating with an absolute weight reduced by at least about 80% compared to before heating, preferably reduced by at least about 95% compared to before heating. Preferred solvents according to the invention are those which allow an electro-conductive paste to be formed which has favourable viscosity, printability, stability and adhesive characteristics and which yields electrodes with favourable electrical conductivity and electrical contact to the substrate. Solvents are well known to the person skilled in the art.

All solvents which are known to the person skilled in the art and which he considers to be suitable in the context of this invention can be employed as the solvent in the thermosetting system. According to the invention preferred solvents are those which allow the preferred high level of printability of the electro-conductive paste as described above to be achieved. Preferred solvents according to the invention are those which exist as a liquid under standard ambient temperature and pressure (SATP) (298.15 K, 25° C., 77° F.), 100 kPa (14.504 psi, 0.986 atm), preferably those with a boiling point above about 90° C. and a melting point above about −20° C.

Preferred solvents according to the invention are polar or non-polar, protic or aprotic, aromatic or non-aromatic, wherein protic polar solvents are preferred according to one aspect of this embodiment. Preferred solvents according to the invention are mono-alcohols, di-alcohols, poly-alcohols, mono-esters, di-esters, poly-esters, mono-ethers, di-ethers, poly-ethers, solvents which comprise at least one or more of these categories of functional group, optionally comprising other categories of functional group, preferably cyclic groups, aromatic groups, unsaturated-bonds, alcohol groups with one or more O atoms replaced by heteroatoms, ether groups with one or more O atoms replaced by heteroatoms, esters groups with one or more O atoms replaced by heteroatoms, and mixtures of two or more of the aforementioned solvents. Preferred esters in this context are di-alkyl esters of adipic acid, preferred alkyl constituents being methyl, ethyl, propyl, butyl, pentyl, hexyl and higher alkyl groups or combinations of two different such alkyl groups, preferably dimethyladipate, and mixtures of two or more adipate esters. Preferred ethers in this context are diethers, preferably dialkyl ethers of ethylene glycol, preferred alkyl constituents being methyl, ethyl, propyl, butyl, pentyl, hexyl and higher alkyl groups or combinations of two different such alkyl groups, and mixtures of two diethers. Preferred alcohols in this context are primary, secondary and tertiary alcohols, preferably tertiary alcohols, terpineol and its derivatives being preferred, or a mixture of two or more alcohols. Preferred solvents which combine more than one different functional groups are 2,2,4-trimethyl-1,3-pentanediol monoisobutyrate, often called texanol, and its derivatives, 2-(2-ethoxyethoxyl)ethanol, often known as carbitol, its alkyl derivatives, preferably methyl, ethyl, propyl, butyl, pentyl, and hexyl carbitol, preferably hexyl carbitol or butyl carbitol, and acetate derivatives thereof, preferably butyl carbitol acetate, or mixtures of at least 2 of the aforementioned.

Thermoplastic System

In one embodiment of the invention, the polymer system is a thermoplastic system.

Preferred thermoplastic systems in the context of the invention ensure that the constituents of the electro-conductive paste are present in the form of solutions, emulsions or dispersions and facilitate the formation of a solid electrode on heating. Preferred thermoplastic systems are those which provide optimal stability of constituents within the electro-conductive paste and endow the electro-conductive paste with a viscosity allowing effective line printability.

Preferred thermoplastic systems according to the invention comprise as components:

1. A thermoplastic polymer;
2. A solvent.

In one embodiment of the invention, it is preferred that the thermoplastic system not exhibit any thermal hysteresis of hardness when heating and cooling to any temperature below the melting temperature of the thermoplastic polymer.

Thermoplastic Polymer

Thermoplastic polymers are well known to the skilled person and he may employ any thermoplastic polymer which he considers suitable for enhancing the favourable properties of the paste or resultant electrode, in particular the curing capability of the paste and the electrical contact between the electrode and the substrate. Preferred thermoplastic polymers show good adhesion on the wafer of the photovoltaic solar cell, are chemically stable under the conditions under which the photovoltaic solar cell is operated in order to guaranty a long operation time of the photovoltaic solar cell, shall not melt at the operation temperatures of the photovoltaic solar cell and should not particular harm the conductivity of the Ag electrode of the photovoltaic solar cell.

Preferred thermoplastic polymers are linear homo- and copolymers. Preferred thermoplastic polymers in the context of the invention are one or more selected from the following list: PVB (polyvinylbutyral); PE (polyethylene); PP (polypropylen), PS (polystyrene); ABS (copolymer of acrylonitrile, butadiene and styrene); PA (polyamide); PC (polycarbonate); polyester, preferably Vitel 2700B from Bostik, Inc.; poly acrylate, preferably Paraloid B44 from Dow Chemical; phenoxy polymer, preferably PKHH from InChem Corp.

Solvent in the Thermoplastic System

The solvents in the thermoplastic system are preferably constituents of the thermoplastic system which are removed to a significant extent during heating, preferably those which are present after heating with an absolute weight reduced by at least about 80% compared to before heating, preferably reduced by at least about 95% compared to before heating.

Preferred solvents according to the invention are those which allow an electro-conductive paste to be formed which has favourable viscosity, printability, stability and adhesive characteristics and which yields electrodes with favourable electrical conductivity and electrical contact to the substrate. Solvents are well known to the person skilled in the art. All solvents which are known to the person skilled in the art and which he considers to be suitable in the context of this invention can be employed as the solvent in the organic vehicle. According to the invention preferred solvents are those which allow the preferred high level of printability of the electro-conductive paste as described above to be achieved. Preferred solvents according to the invention are those which exist as a liquid under standard ambient temperature and pressure (SATP) (298.15 K, 25° C., 77° F.), 100 kPa (14.504 psi, 0.986 atm), preferably those with a boiling point above about 90° C. and a melting point above about −20° C.

Preferred solvents for the thermoplastic system are poor hydrogen bonding solvents or moderate hydrogen bonding solvents.

Preferred poor hydrogen bonding solvents are aromatics, aliphatics or halogenated solvents. Preferred poor hydrogen bonding solvents are those with a Hildebrand parameter in the range from about 8.5 to about 12, preferably benzene (Hildebrand parameter 9.2), monochlorabenzene (Hildebrand parameter 9.5), or 2-Nitropropane (Hildebrand parameter 10.7).

Preferred moderate hydrogen bonding solvents are solvents comprising esters, ethers or ketones. Preferred moderate hydrogen bonding solvents are those with a Hildebrand parameter in the range from about 8.3 to about 10.5, preferably THF (Tetrahydrofuran—Hildebrand parameter 9.8), cyclohexanone (Hildebrand parameter 9.9), or n-n-butyl acetate (Hildebrand parameter 8.0).

The following are also preferred solvents for the thermoplastic system: DMPU (1,3-dimethyl-3,4,5,6-tetrahydro-2(1H)-pyrimidinone), iso-tridecanol, dichloro methane, HMPT (hexamethylphosphoramide), DMSO (dimethyl sulfoxide), dioxane, methyl cellusolve, cellosolve acetate, MEK (methyl ethyl ketone), acetone, nitroethane, xylene, toluene, solvesso, NMP (N-Methyl-2-pyrrolidone), glycol ethers, glycol esters.

Additives in the Electro-Conductive Paste

Preferred additives in the context of the invention are constituents added to the electro-conductive paste, in addition to the other constituents explicitly mentioned, which contribute to increased performance of the electro-conductive paste, of the electrodes produced thereof or of the resulting solar cell. All additives known to the person skilled in the art and which he considers suitable in the context of the invention can be employed as additive in the electro-conductive paste. In addition to additives present in the vehicle, additives can also be present in the electro-conductive paste. Preferred additives according to the invention are thixotropic agents, viscosity regulators, emulsifiers, stabilising agents or pH regulators, thickeners and dispersants or a combination of at least two thereof.

Radical Generator

In one embodiment of the invention, a radical generator is further comprised in the paste. Radical generators are well known to the skilled person and he can select a radical generator which is suitable for bringing about advantageous properties, such as hardening and/or adhesion. Quite often, hardening and adhesion is accomplished by cross-linking reactions, preferably based on at least two double bonds per molecule to be cross-linked, preferably triggered by generators. Preferred radical generators in the context of the invention are those which initiate a radical chain reaction in the above described polymers, preferably a cross-linking chain reaction. Preferred radical generators are peroxides, preferably organic peroxides; and azo compounds, preferably organic azo compounds.

In a further embodiment of the invention, the thermosetting system does not require a radical generator. Alternative means of initiating the thermosetting process include heating or exposure to light or other electro-magnetic radiation, e.g. electron beam radiation or UV irradiation.

Solar Cell Precursor

A contribution to achieving at least one of the above described objects is made by a solar cell precursor. Preferred solar cell precursors according to the invention comprise the following:

1. a wafer, preferably a silicon wafer, preferably a HIT type wafer,
2. a paste according to the invention;

wherein the paste is located on or over at least one surface of the wafer. The paste may be in physical contact with the silicon wafer or alternatively it may be in contact with the outermost of one or more further layers which are present in between the silicon wafer and the paste, such as a transparent conductive layer or a physically protective layer.

In one embodiment of the invention, one or more further pastes are present on the wafer in addition to the paste according to the invention.

In one embodiment of the invention, the precursor is a precursor to an MWT cell. In this embodiment, a channel connecting the front and back faces of the wafer is preferably present. The paste according to the invention is preferably in contact with the surface of the channel, or on a surface other than the surface or the channel, or both.

In one embodiment of the invention, the solar cell precursor is a precursor to an n-type solar to cell. In one aspect of this embodiment, the proportion of the volume of the wafer corresponding to n-doped layers is greater than that corresponding to p-type layers. In another aspect of this embodiment, the front face, sometimes called the sunny side, of the wafer is p-type doped. In another aspect of this embodiment the back face of the wafer is n-type doped.

In one embodiment of the invention, the solar cell precursor is a precursor to a p-type solar cell. In one aspect of this embodiment, the proportion of the volume of the wafer corresponding to p-doped layers is greater than that corresponding to n-type layers. In another aspect of this embodiment, the front face, sometimes called the sunny side, of the wafer is n-type doped. In another aspect of this embodiment the back face of the wafer is p-type doped.

HIT type solar cell precursors are preferred in the context of the invention. In one aspect of this embodiment, the wafer comprises at least one layer of amorphous Si. Preferably, at least one layer of amorphous Si is n-type doped. Preferably, at least one layer of amorphous Si is p-type doped. Preferably at least one or more than one, preferably two, layers of amorphous Si are intrinsic (non-doped). Preferably, the wafer comprises at least one crystalline layer, preferably n-type doped or p-type doped, preferably n-type doped.

In the preparation of the solar cell precursor, it is preferred for the temperature to be maintained low, preferably below 100° C., more preferably below about 80° C., most preferably below about 60° C.

Process for Producing a Solar Cell

A contribution to achieving at one of the aforementioned objects is made by a process for producing a solar cell at least comprising the following as process steps:

i) provision of a solar cell precursor as described above, in particular combining any of the above described embodiments; and ii) heating of the solar cell precursor to obtain a solar cell.

It is preferred that the temperature in step i) not exceed 100° C., preferably 80° C., preferably 60° C.

Printing

It is preferred according to the invention that each of the electrodes be provided by applying an electro-conductive paste and then heating that electro-conductive paste to obtain an adhered body. The electro-conductive paste can be applied in any manner known to the person skilled in that art and which he considers suitable in the context of the invention including but not limited to impregnation, dipping, pouring, dripping on, injection, spraying, knife coating, curtain coating, brushing or printing or a combination of at least two thereof, wherein preferred printing techniques are ink jetprinting, screen printing, tampon printing, offset printing, relief printing or stencil printing or a combination of at least two thereof. It is preferred according to the invention that the electro-conductive paste is applied by printing, preferably by screen printing. It is preferred according to the invention that the screens have mesh opening with a diameter in a range from about 20 to about 100 μm, more preferably in a range from about 30 to about 80 μm, and most preferably in a range from about 40 to about 70 μm. As detailed in the solar cell precursor section, it is preferred for the electro-conductive paste applied to the channel to be as described in this invention. The electro-conductive pastes used to form the front and back electrodes can be the same or different to the paste used in the channel, preferably different, and can be the same as or different to each other.

It is preferred for printing not to be carried out at a high temperature, preferably below 100° C., more preferably below about 80° C., more preferably below about 50° C.

Heating

It is preferred according to the invention for electrodes to be formed by first applying an electro-conductive paste and then heating said electro-conductive paste to yield a solid electrode body. Heating is well known to the person skilled in the art and can be effected in any manner known to him and which he considers suitable in the context of the invention.

According to the invention, the maximum temperature set for the heating is below about 250° C., preferably below about 230° C., more preferably below about 210° C. Heating temperatures as low as about 100° C. have been employed for obtaining solar cells.

Heating of electro-conductive pastes on the front face and back face can be carried out simultaneously or sequentially. Simultaneous heating is appropriate if the electro-conductive pastes have similar, preferably identical, optimum heating conditions. Where appropriate, it is preferred according to the invention for heating to be carried out simultaneously.

Solar Cell

A contribution to achieving at least one of the above described objects is made by a solar cell obtainable by a process according to the invention. Preferred solar cells according to the invention are those which have a high efficiency in terms of proportion of total energy of incident light converted into electrical energy output and which are light and durable.

Anti-Reflection Coating

According to the invention, an anti-reflection coating can be applied as the outer and often as the outermost layer before the electrode on the front face of the solar cell. Preferred anti-reflection coatings according to the invention are those which decrease the proportion of incident light reflected by the front face and increase the proportion of incident light crossing the front face to be absorbed by the wafer. Anti-reflection coatings which give rise to a favourable absorption/reflection ratio, are susceptible to etching by the employed electro-conductive paste but are otherwise resistant to the temperatures required for heating of the electro-conductive paste, and do not contribute to increased recombination of electrons and holes in the vicinity of the electrode interface are favoured. All anti-reflection coatings known to the person skilled in the art and which he considers to be suitable in the context of the invention can be employed. Preferred anti-reflection coatings according to the invention are $SiN_x$, $SiO_2$, $Al_2O_3$, $TiO_2$ or mixtures of at least two thereof and/or combinations of at least two layers thereof, wherein $SiN_x$, is particularly preferred, in particular where an Si wafer is employed. In particular for HIT cells metal oxides can serve as an anti-reflection coating. Preferred oxides are indium tin oxide (ITO), fluorine doped tin oxide (FTO) or doped zinc oxide, preferably indium tin oxide.

The thickness of anti-reflection coatings is suited to the wavelength of the appropriate light. According to the invention it is preferred for anti-reflection coatings to have a thickness in a range from about 30 to about 500 nm, more preferably in a range from about 50 to about 400 nm and most preferably in a range from about 80 to about 300 nm.

Passivation Layers

According to the invention, one or more passivation layers can be applied to the front and/or back side as outer or as the outermost layer before the electrode, or before the anti-reflection layer if one is present. Preferred passivation layers are those which reduce the rate of electron/hole recombination in the vicinity of the electrode interface. Any passivation layer which is known to the person skilled in the art and which he considers to be suitable in the context of the invention can be employed. Preferred passivation layers according to the invention are silicon nitride, silicon dioxide and titanium dioxide, silicon nitride being most preferred. According to the invention, it is preferred for the passivation layer to have a thickness in a range from about 0.1 nm to about 2 μm, more preferably in a range from about 1 nm to about 1 μm and most preferably in a range from about 5 nm to about 200 nm. It is preferred for HIT cells that an intrinsic Si layer functions as a passivation layer. The function of an anti-reflection coating and a passivation layer can be at least partly or completely combined in one layer.

Transparent Conductive Layer

Preferred transparent conductive layers in the context of the invention are layers on or over the silicon wafer which have a high transparency and conductivity. The transmission of light with a wavelength of 400 nm through the layer is preferably above about 50%, more preferably above about 80%, most preferably above about 90%. The electrical conductivity of the layer is preferably above about $1*10^{-4}$ $\Omega^{-1}$ $cm^{-1}$, more preferably above about $5*10^{-3}$ $\Omega^{-1}$ $cm^{-1}$, most preferably above about $5*10^{-2}$ $\Omega^{-1}$ $cm^{-1}$.

The thickness of the transparent conductive layer is preferably in the range from about 30 to about 500 nm, more preferably in the range from about 50 to about 400 nm, most preferably in the range from about 80 to about 300 nm.

Transparent conductive materials are well known to the skilled person and he may select the material in order to improve the advantageous properties of the solar cell, such as conductivity, transparency and adhesion. Preferred materials are oxides, conductive polymers or carbon nano-tube based conductors, preferably oxides. Preferred oxides are indium tin oxide (ITO), fluorine doped tin oxide (FTO) or doped zinc oxide, preferably indium tin oxide. Preferred conductive polymers are organic compounds with conjugated double bonds, preferably polyacetylenes, polyanilines, polypyrroles or polythiophenes or derivatives thereof, or combinations thereof.

In one embodiment, the solar cell has a transparent conductive layer on the front face.

Electrodes

In one embodiment of the invention, the bimodal distribution of Ag particles of the paste is present in the electrode. In individual aspects of this embodiment, the individual features relating to the diameter distribution of Ag in the paste are analogously present in the electrode.

Additional Protective Layers

In addition to the layers described above which directly contribute to the principle function of the solar cell, further layers can be added for mechanical and chemical protection. The cell can be encapsulated to provide chemical protection. Encapsulations are well known to the person skilled in the art and any encapsulation can be employed which is known to him and which he considers suitable in the context of the invention. According to the invention, transparent polymers, often referred to as transparent thermoplastic resins, are preferred as the encapsulation material, if such an encapsulation is present. Preferred transparent polymers in this context are for example silicon rubber and polyethylene vinyl acetate (PVA).

A transparent glass sheet can be added to the front of the solar cell to provide mechanical protection to the front face of the cell. Transparent glass sheets are well known to the person skilled in the art and any transparent glass sheet known to him and which he considers to be suitable in the context of the invention can be employed as protection on the front face of the solar cell.

A back protecting material can be added to the back face of the solar cell to provide mechanical protection. Back protecting materials are well known to the person skilled in the art and any back protecting material which is known to the person skilled in the art and which he considers to be suitable in the context of the invention can be employed as protection on the back face of the solar cell. Preferred back protecting materials according to the invention are those having good mechanical properties and weather resistance. The preferred back protection materials according to the invention is polyethylene terephthalate with a layer of polyvinyl fluoride. It is preferred according to the invention for the back protecting material to be present underneath the encapsulation layer (in the event that both a back protection layer and encapsulation are present).

A frame material can be added to the outside of the solar cell to give mechanical support. Frame materials are well known to the person skilled in the art and any frame material known to the person skilled in the art and which he considers suitable in the context of the invention can be employed as frame material. The preferred frame material according to the invention is aluminium.

Solar Panels

A contribution to achieving at least one of the above mentioned objects is made by a module comprising at least a solar cell obtained as described above, in particular according to at least one of the above described embodiments, and at least one more solar cell. A multiplicity of solar cells according to the invention can be arranged spatially and electrically connected to form a collective arrangement called a module. Preferred modules according to the invention can take a number of forms, preferably a rectangular surface known as a solar panel. A large variety of ways to electrically connect solar cells as well as a large variety of ways to mechanically arrange and fix such cells to form collective arrangements are well known to the person skilled in the art and any such methods known to him and which he considers suitable in the context of the invention can be employed. Preferred methods according to the invention are those which result in a low mass to power output ratio, low volume to power output ration, and high durability. Aluminium is the preferred material for mechanical fixing of solar cells according to the invention.

DESCRIPTION OF THE DRAWINGS

The invention is now explained by means of figures which are intended for illustration only and are not to be considered as limiting the scope of the invention. In brief.

FIG. 1*a* shows a cross sectional view of a common n-type layer configuration for a solar cell. Starting from the front side, 101 are electrodes, preferably in the form of fingers, preferably obtained from a paste according to the invention by a method according to the invention. 102 is one or more optional layers, such as an anti-reflection layer or a passivation layer. 103 is a p-doped from layer, preferably an Si layer. 104 is an n-doped back layer, preferably an Si layer. 105 is the back electrode, preferably obtained from a paste according to the invention by a method according to the invention.

FIG. 1*b* shows a cross sectional view of a common p-type layer configuration for a solar cell. Starting from the front side, 101 are electrodes, preferably in the form of fingers, preferably obtained from a paste according to the invention by a method according to the invention. 102 is one or more optional layers, such as an anti-reflection layer or a passivation layer. 104 is an n-doped from layer, preferably an Si layer. 103 is a p-doped back layer, preferably an Si layer. 105 is the back electrode, preferably obtained from a paste according to the invention by a method according to the invention.

FIG. 2 shows a cross sectional view of a common HIT type layer configuration for a solar cell. 101 are electrodes, preferably in the form of fingers, preferably obtained from a paste according to the invention by a method according to the invention. 201 is one or more optional layers, preferably comprising a transparent conductive layer, such as indium tin oxide. 202 is an amorphous front layer, preferably an Si layer, of a first doping type, n-type or p-type, preferably p-type. 203 is an intrinsic (non-doped) amorphous front layer, preferably an Si layer. 204 is crystalline layer, preferably an Si layer, preferably n-type doped. 205 is an intrinsic (non-doped) amorphous back layer. 206 is an amorphous front layer, preferably an Si layer, or the opposite doping type to the first doping type, preferably n-type doped. 105 is the back electrode, preferably obtained from a paste according to the invention by a method according to the invention.

FIG. 3*a* shows strips on a solar cell without cracking. 401 is the substrate surface. 402 is the electrode strip. No cracks are present in the electrode strip 402.

FIG. 3*b* shows strips on a solar cell with cracking. 401 is the substrate surface. 402 is the electrode strip. Cracks 403 are present in the electrode strip 402.

FIG. 4 shows the positioning of cuts 421 relative to finger lines 422 in the wafer 420 for the test method below to measure specific contact resistance.

FIG. 5 displays part of an exemplary electron micrograph cross-sectional cut of a processed wafer exhibiting silver particles. The area corresponding to silver content 601, in contrast to area corresponding to non-silver content 602, was identified and filled with circles of decrementing diameter according to the algorithm given in the test method for determining particle diameter distribution in the electrode. For purposes of clarity, FIG. 5 shows the image at the point where the fitting algorithm has been partially completed, for diameters decremented from 50 μm down to 0.5 μm. FIG. 5 shows an exemplary portion of the area to be analysed according to the test method (1 $mm^2$).

FIG. 6 shows an exemplary bi-modal diameter distribution of silver particles in a plug electrode as determined by the test method. Local maxima 801 are present giving a corresponding separation Δ. Measurements were taken at 0.1 μm intervals in a range from 0 to 50 μm (for clarity, only the lower diameter portion of the graph is shown). The graph is normalized such that the frequencies sum to 1.

Test Methods

Figure 1A:
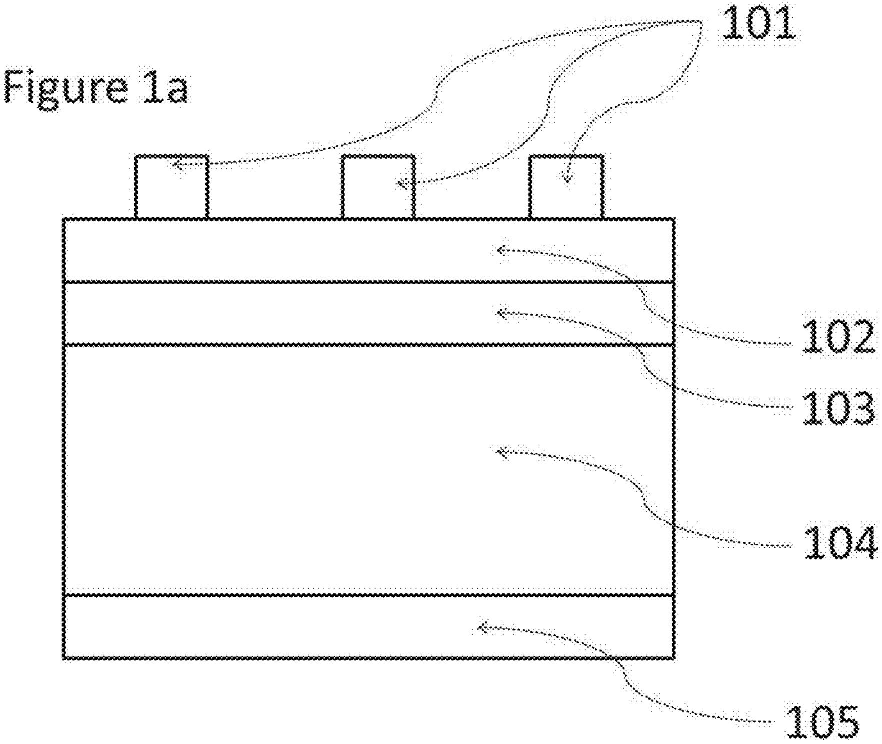
FIG. 1*a* shows a cross sectional view of a common n-type layer configuration for a solar cell.
Figure 1B:
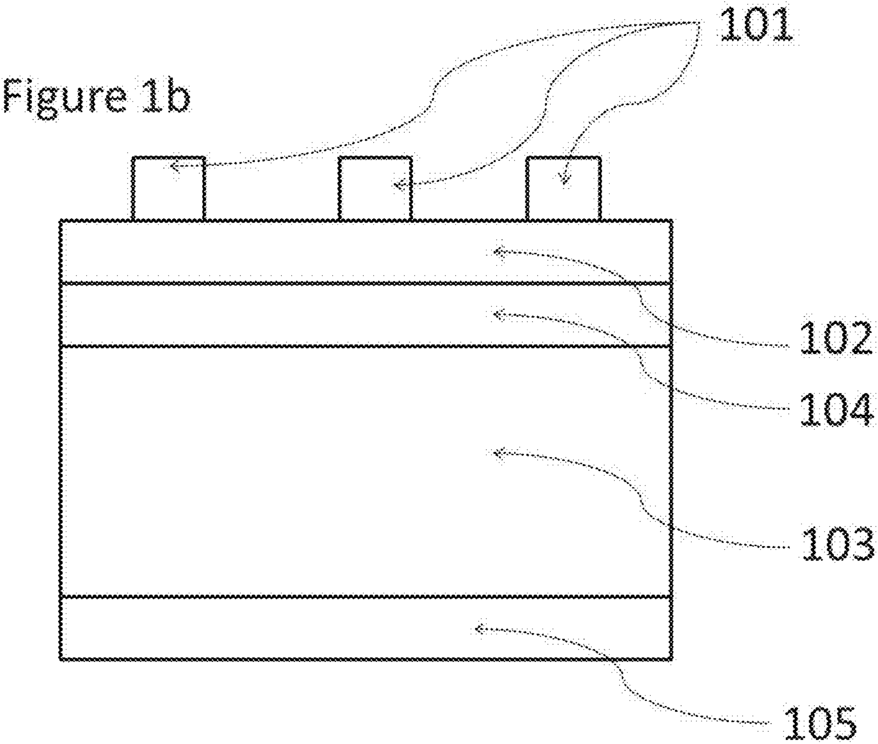
FIG. 1*b* shows a cross sectional view of a common p-type layer configuration for a solar cell.
Figure 2:
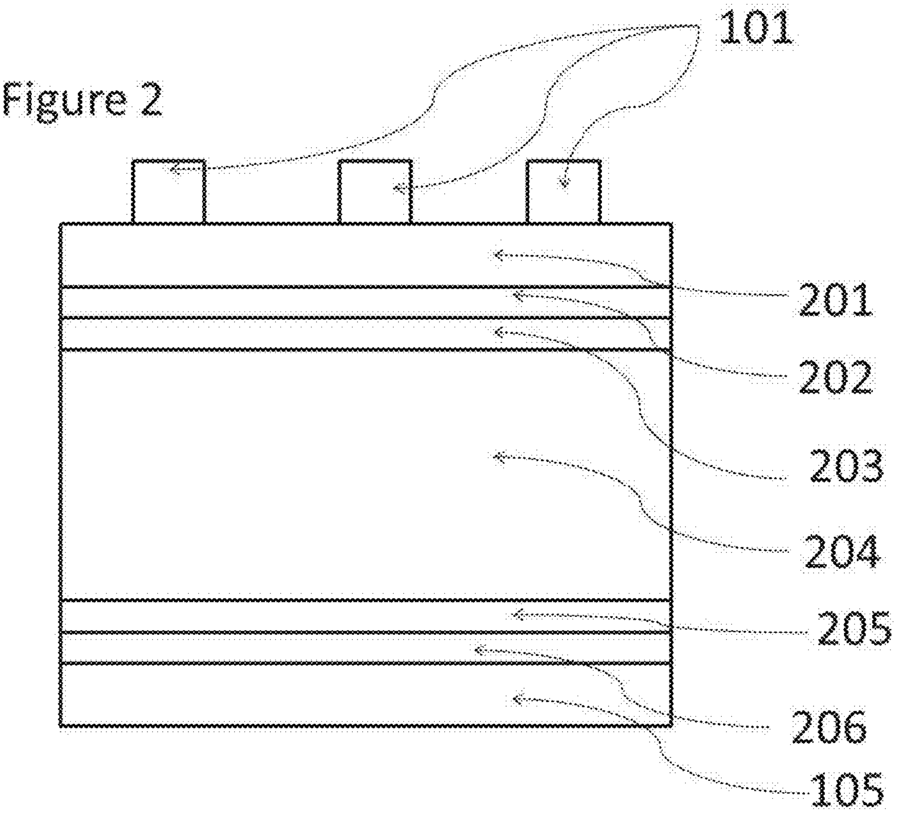
FIG. 2 shows a cross sectional view of a common HIT-type layer configuration for a solar cell.

The following test methods are used in the invention. In absence of a test method, the ISO test method for the feature to be measured being closest to the earliest filing date of the present application applies. In absence of distinct measuring conditions, standard ambient temperature and pressure (SATP) as a temperature of 298.15 K (25° C., 77° F.) and an absolute pressure of 100 kPa (14.504 psi, 0.986 atm) apply.

Specific Surface Area

BET measurements to determine the specific surface area of silver particles are made in accordance with DIN ISO 9277:1995. A Gemini 2360 (from Micromeritics) which works according to the SMART method (Sorption Method with Adaptive dosing Rate), is used for the measurement. As reference material Alpha aluminium oxide CRM BAM-PM-102 available from BAM (Bundesanstalt für Materialforschung und-prüfung) is used. Filler rods are added to the reference and sample cuvettes in order to reduce the dead volume. The cuvettes are mounted on the BET apparatus. The saturation vapour pressure of nitrogen gas ($N_2$ 5.0) is determined A sample is weighed into a glass cuvette in such an amount that the cuvette with the filler rods is completely filled and a minimum of dead volume is created. The sample is kept at 80° C. for 2 hours in order to dry it. After cooling the weight of the sample is recorded. The glass cuvette containing the sample is mounted on the measuring apparatus. To degas the sample, it is evacuated at a pumping speed selected so that no material is sucked into the pump. The mass of the sample after degassing is used for the calculation. The dead volume is determined using Helium gas (He 4.6). The glass cuvettes are cooled to 77 K using a liquid nitrogen bath. For the adsorptive, $N_2$ 5.0 with a molecular cross-sectional area of 0.162 $nm^2$ at 77 K is used for the calculation. A multi-point analysis with 5 measuring points is performed and the resulting specific surface area given in $m^2/g$.

Viscosity

Viscosity measurements were performed using the Thermo Fischer Scientific Corp. “Haake Rheostress 600” equipped with a ground plate MPC60 Ti and a cone plate C 20/0.5° Ti and software “Haake RheoWin Job Manager 4.30.0”. After setting the distance zero point, a paste sample sufficient for the measurement was placed on the ground plate. The cone was moved into the measurement positions with a gap distance of 0.026 mm and excess material was removed using a spatula. The sample was equilibrated to 25° C. for three minutes and the rotational measurement started. The shear rate was increased from 0 to 20 $s^{-1}$ within 48 s and 50 equidistant measuring points and further increased to 150 $s^{-1}$ within 312 s and 156 equidistant measuring points. After a waiting time of 60 s at a shear rate of 150 $s^{-1}$, the shear rate was reduced from 150 $s^{-1}$ to 20 $s^{-1}$ within 312 s and 156 equidistant measuring points and further reduced to 0 within 48 s and 50 equidistant measuring points. The micro torque correction, micro stress control and mass inertia correction were activated. The viscosity is given as the measured value at a shear rate of 100 $s^{-1}$ of the downward shear ramp.

Particle Size Determination ($d_{10}$, $d_{50}$, $d_{90}$ and Particle Distribution of Powder)

Particle size determination for particles is performed in accordance with ISO 13317-3:2001. A Sedigraph 5100 with software Win 5100 V2.03.01 (from Micromeritics) which works according to X-ray gravitational technique is used for the measurement. A sample of about 400 to 600 mg is weighed into a 50 ml glass beaker and 40 ml of Sedisperse P11 (from Micromeritics, with a density of about 0.74 to 0.76 $g/cm^3$ and a viscosity of about 1.25 to 1.9 mPa·s) are added as suspending liquid. A magnetic stiffing bar is added to the suspension. The sample is dispersed using an ultrasonic probe Sonifer 250 (from Branson) operated at power level 2 for 8 minutes while the suspension is stirred with the stirring bar at the same time. This pre-treated sample is placed in the instrument and the measurement started. The temperature of the suspension is recorded (typical range 24° C. to 45° C.) and for calculation data of measured viscosity for the dispersing solution at this temperature are used. Using density and weight of the sample (10.5 $g/cm^3$ for silver) the particle size distribution function is determined $d_{50}$, $d_{10}$ and $d_{90}$ can be read directly from the particle distribution function. For the evaluation of multi-modal size, distribution plots of mass frequency against diameter are generated and the peak maxima are determined therefrom.

Particle Size Determination ($d_{10}$, $d_{50}$, $d_{90}$ and Particle Distribution in Paste)

For the determination of the size distribution of the metal particles in the paste, the following procedure was followed. The organic part is removed by solvent extraction using solvents such as methanol, ethanol, isopropanol, dichloromethane, chloroform, hexane. This can be performed using a Soxhlet apparatus or a combination of dissolution, sedimentation and filtration techniques known to the person skilled in the art. The inorganic part except the metal particles is removed by treatment with aqueous non-oxidizing acids such as hydrochloric acid etc., followed by treatment with bases such as aqueous sodium hydroxide, potassium hydroxide etc. followed by treatment with aqueous hydrofluoric acid. This can be performed using a Soxhlet apparatus or a combination of dissolution, sedimentation and filtration techniques. In a final step, the remaining metal particles are washed with deionized water and dried. Particle size of the resulting powder is measured as described for powders above.

Dopant Level

Dopant levels are measured using secondary ion mass spectroscopy.

Adhesion

The solar cell sample to be tested is secured in a commercially available soldering table M300-0000-0901 from Somont GmbH, Germany. A solder ribbon from Bruker Spalek (ECu+62Sn-36Pb-2Ag) is coated with flux Kester 952S (from Kester) and adhered to the finger line or bus bar to be tested by applying the force of 12 heated pins which press the solder ribbon onto the finger line or bus bar. The heated pins have a set temperature of 280° C. and the soldering preheat plate on which the sample is placed is set to a temperature of 175° C. After cooling to room temperature, the samples are mounted on a GP Stable-Test Pro tester (GP Solar GmbH, Germany). The ribbon is fixed at the testing head and pulled with a speed of 100 mm/s and in a way that the ribbon part fixed to the cell surface and the ribbon part which is pulled enclose an angle of 45°. The force required to remove the bus bar/finger is measured in Newton. This process is repeated for contact at 10 equally spaced points along the finger/bus bar, including one measurement at each end. The mean is taken of the 10 results.

Scanning Electron Microscopy (SEM) and Energy Dispersive X-Ray Spectroscopy (EDX)

The solar cell is cut in a way that the area of interest is laid open. The cut sample is placed in a container filled with embedding material and oriented such that the area of interest is on top. As embedding material, EpoFix (Struers) is used, mixed according to the instructions. After 8 hours curing at room temperature the sample can be processed further. In a first step the sample is ground with a Labopol-25 (Struers) using silicon carbide paper 180-800 (Struers) at 250 rpm. In further steps the sample is polished using a Rotopol-2 equipped with a Retroforce-4, MD Piano 220 and MD allegro cloth and DP-Spray P 3 μm diamond spray (all from Struers). Coating with a carbon layer is performed with a Med 010 (Balzers) at a pressure of 2 mbar using a carbon thread 0.27 g/m E419ECO (from Plano GmbH). The examination was performed with a Zeiss Ultra 55 (Zeiss), equipped with a field emission electrode, an accelerating voltage of 20 kV and at a pressure of about $3*10^{-6}$ mbar. Images of relevant areas were taken and analysed using image analysis software ImageJ Version 1.46r (Image Processing and analysis in Java, by Wayne Rasband, http://rsb.info.nih.gov/ij). In order to identify Ag particles, the intense $Ag_L$ signal at about 3.4 keV in EDX was used to identify 10 silver particles and the average SEM greyscale intensity for those 10 particles was used to identify further Ag particles from the SEM picture.

Particle Diameter of Ag in Electrode

A cross sectional cut was made through the electrode and processed as described in the SEM test section above to give three square cross sectional samples from within the electrode with an area of 1 $mm^2$For each sample, the areas corresponding to Ag were identified as described in the SEM section. Circles of decrementing diameter were drawn onto the image according to the following algorithm:

1. Superimpose a square grid with a 0.01 μm separation onto the image.
2. Each point either corresponds to an area of silver, or not so. Each point which corresponds to silver is initially available to be allocated to circles. Points which do not correspond to silver are not available to be allocated to circles.
3. Start with a diameter of 50 μm.
4. Starting from the top left point in the grid, proceed through the points of the top row from left to right, carrying out step 4a. for each point. Repeat for subsequent rows from top to bottom, arriving finally at the bottom right, all points having been processed.
   4a. For each point, if all points within a distance equal to half of the current diameter (initially 50 μm) of the point are available to be allocated to circles, then:
      i. draw a circle with a diameter equal to the current diameter centred on the current grid point
      ii. mark all points within a distance equal to half of the current diameter from the point as unavailable to be allocated to circles
      iii. Increase by one the cumulative frequency counter for the current value of the diameter (initially set to 0)
5. Upon having proceeded through all of the grid points for a certain value of particle diameter, record the cumulative frequency counter for that value of diameter, decrement the current diameter by 0.1 μm and carry out step 4. using that value for diameter. Once step 4. has been completed for all values of diameter from 50 μm down to 0.1 μm, the algorithm is complete.

Once the circle drawing algorithm had been carried out, the cumulative frequency counter values were multiplied by the square of the corresponding diameter to better correspond to a mass frequency distribution, a best fit curve was fitted to the data using numerical least square regression and the positions of maxima calculated. The result was given as a mean for the three samples. If the standard deviation for the results of the three samples was more than 15% of the mean value, one further sample was taken and the mean of all samples given. This process was repeated until the standard deviation was less than 15% of the mean value.

Specific Line Resistivity

The line resistivity of 1 cm of the finger was measured by using a "GP4-Test. Pro" equipped with software package "GP-4 Test 1.6.6 Pro" from the company GP solar. For the measuring the 4 point measuring principle is applied. Therefore the two outer probes apply a constant current (10 mA) and two inner probes measure the voltage. The line resistivity is deducted by the Ohmic law in Ohm/cm. The cross section of the measured 1 cm of the finger line was determined by using a "Cyberscan Vantage" (model 2V4-C/5NVK) equipped with the software package "Scan CT 7.6" from the company cyberTechnologies GmbH. The specific line resistivity was calculated by using the determined values for the line resistivity and the cross section of the same 1 cm of the cured finger line in μΩ*cm.

Specific Contact Resistance

Figure 4:
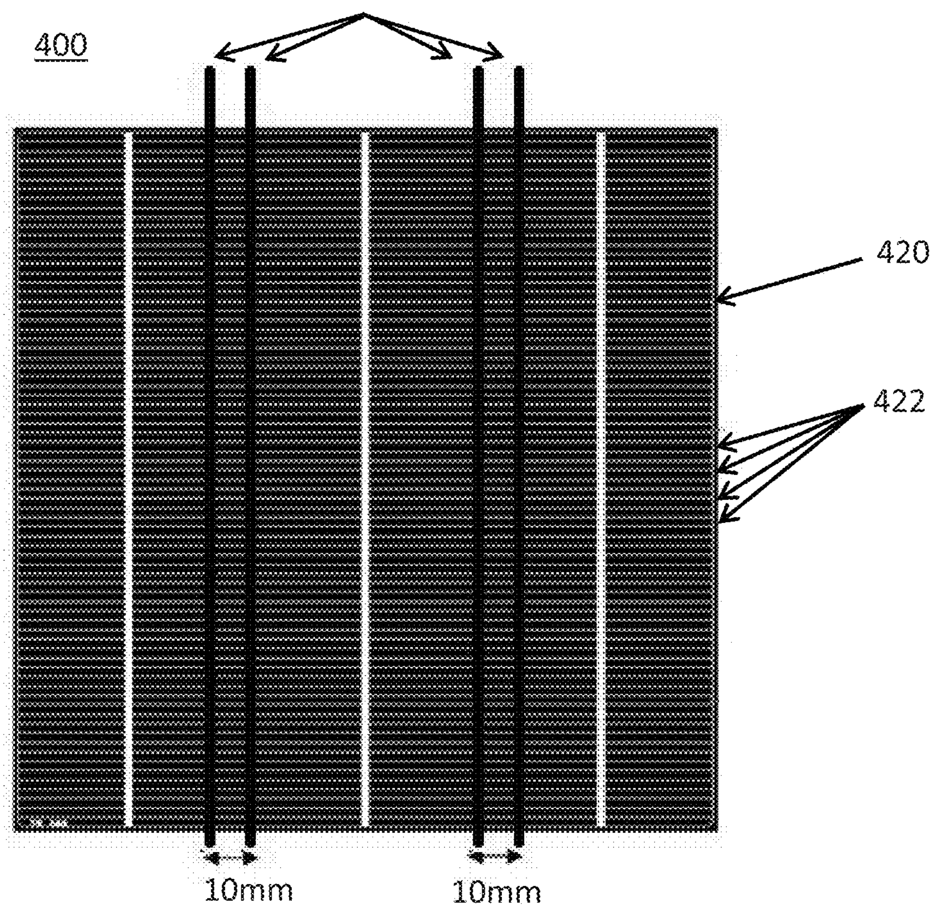
FIG. 4 shows the positioning of cuts for the test method below to measure specific contact resistance.
Figure 5:
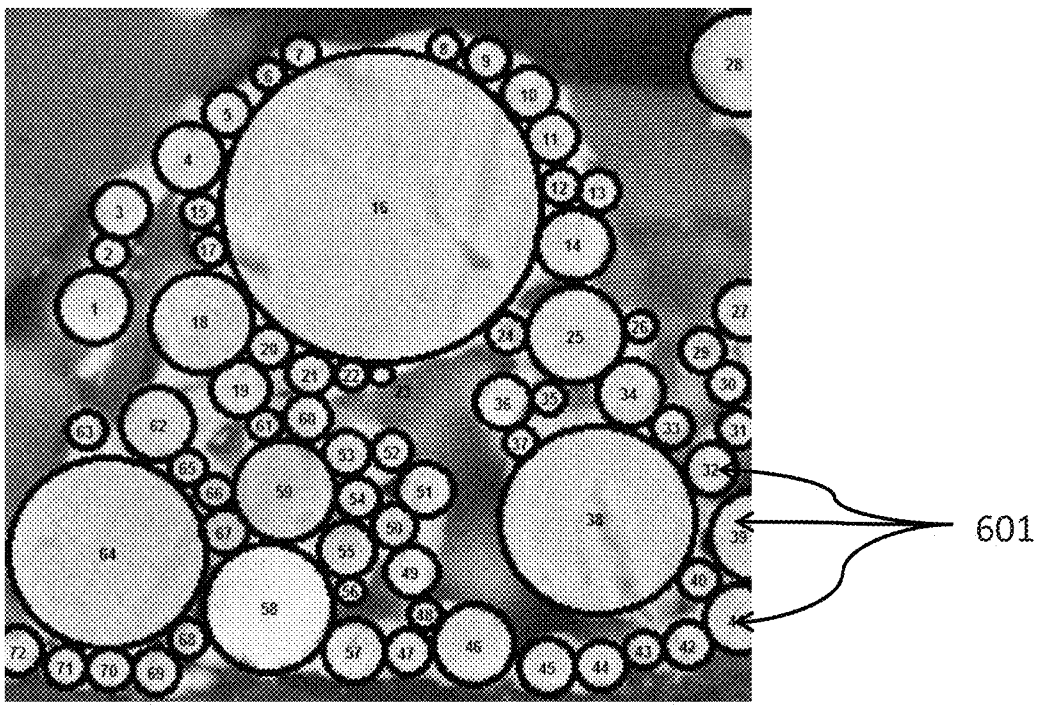
FIG. 5 displays part of an exemplary electron micrograph cross-sectional cut of a processed wafer exhibiting silver particles.
Figure 6:
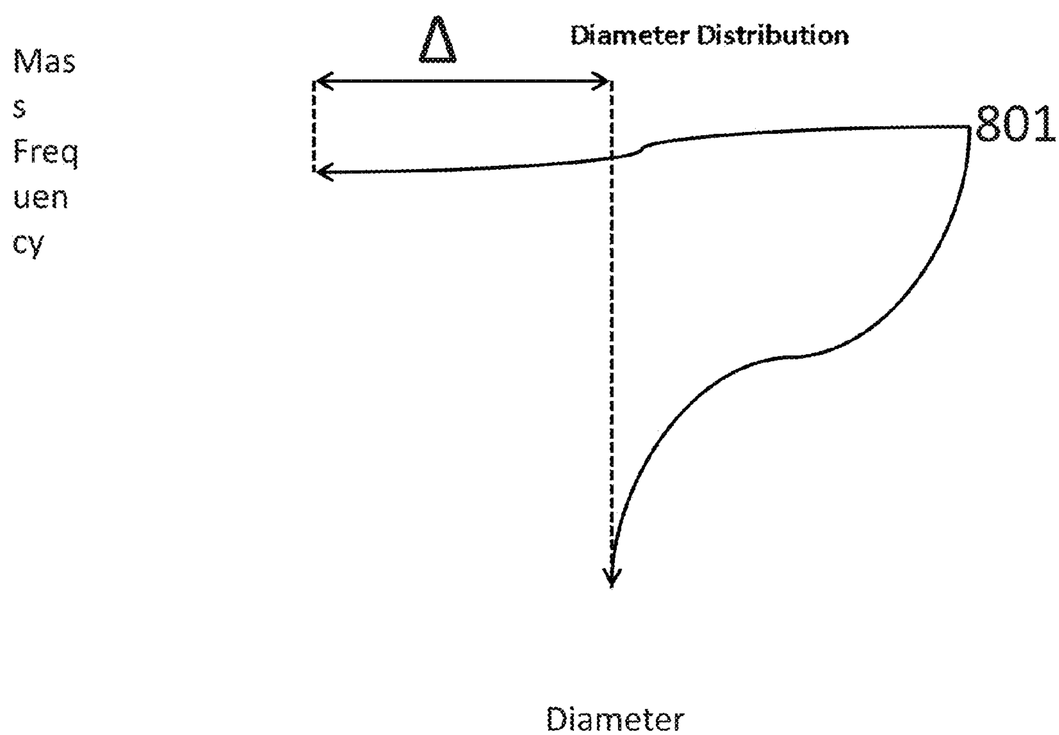
FIG. 6 shows an exemplary bi-modal diameter distribution of silver particles in a plug electrode.

In an air conditioned room with a temperature of 22±1° C., all equipment and materials are equilibrated before the measurement. For measuring the specific contact resistance of cured silver electrodes on the front side (texturized and coated with ITO) of a HIT solar cell a "GP4-Test Pro" equipped with the "GP-4 Test 1.6.6 Pro" software package from the company GP solar GmbH is used. This device applies the 4 point measuring principle and estimates the specific contact resistance by the transfer length method (TLM). To measure the specific contact resistance, two 1 cm wide stripes of the wafer are cut perpendicular to the printed finger lines of the wafer as shown in FIG. 4. The exact width of each stripe is measured by a micrometer with a precision of 0.05 mm. The width of the fired silver fingers is measured on 3 different spots on the stripe with a digital microscope "VHX—600D" equipped with a wide-range zoom lens VH-Z100R from the company Keyence Corp. On each spot, the width is determined ten times by a 2-point measurement. The finger width value is the average of all 30 measurements. The finger width, the stripe width and the distance of the printed fingers to each other is used by the software package to calculate the specific contact resistance. The measuring current is set to 14 mA. A multi contact measuring head (part no. 04.01.0016) suitable to contact 6 neighboring finger lines is installed and brought into contact with 6 neighboring fingers. The measurement is performed on 5 spots equally distributed on each stripe. After starting the measurement, the software determines the value of the specific contact resistance (mOhm*cm$^2$) for each spot on the stripes. The average of all ten spots is taken as the value for specific contact resistance.

Cracking

Figure 3A:
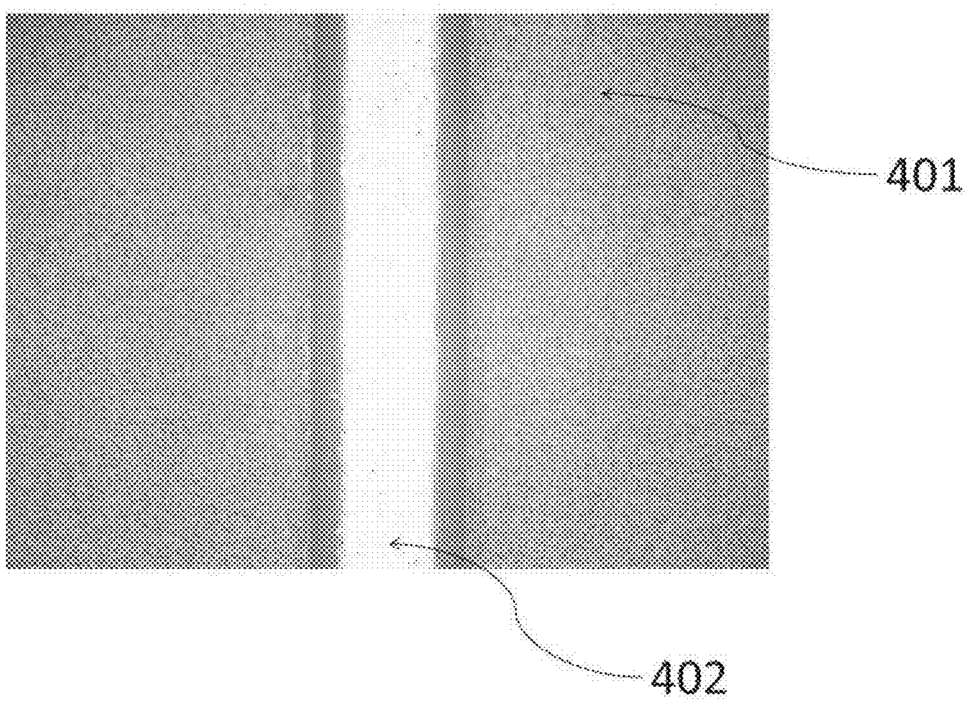
FIG. 3*a* shows an electrode line without cracking
Figure 3B:
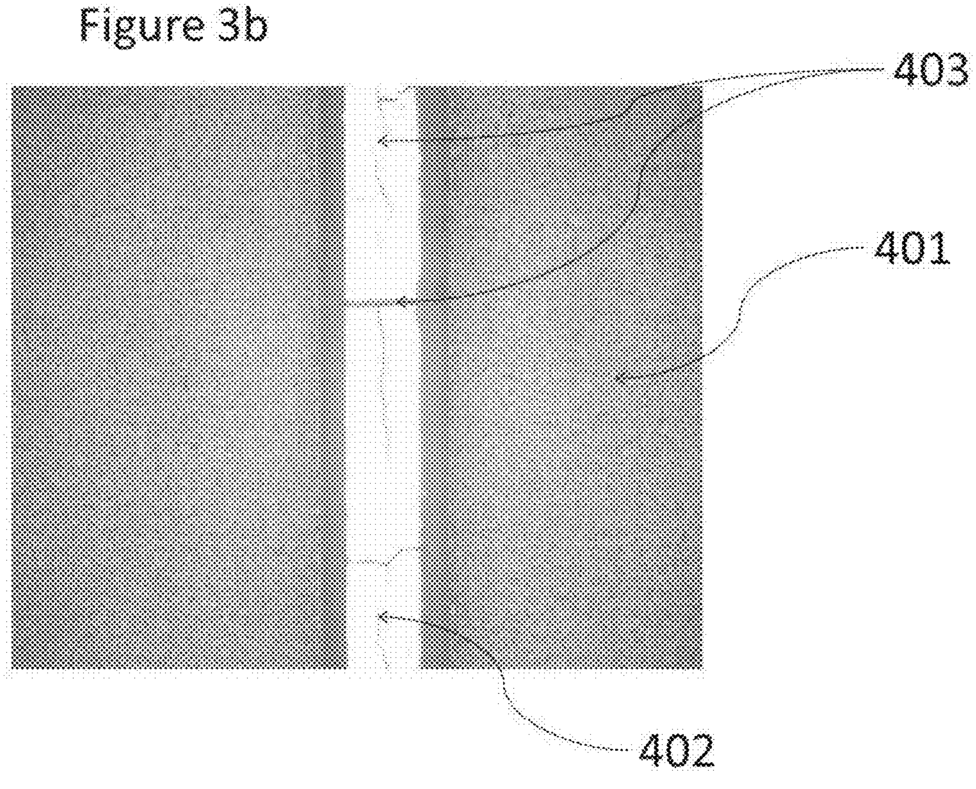
FIG. 3*b* shows an electrode line with cracking

A printed and cured silver paste line was optically inspected for cracks by using a Keyence VHX-600D microscope equipped with a VH-Z100R lens (from Keyence Deutschland GmbH) at a magnification of 100×. In the case cracks were found in the finger line the paste was rated with a "–" and in the absence of cracks with a "+". Examples of cells with and without cracks is shown in FIGS. 3*a* and 3*b*.

Molecular Weight

The molecular weight of the thermoplastic polymers is determined by GPC (Gel Permeation Chromatography) followed by light scattering. For the various thermoplastic polymers GPC conditions such as selection of appropriate columns, eluent, pressure and temperature the DIN procedure valid for the particular thermoplastic polymer on Aug. 29, 2012 shall be applied. If not indicated to the contrary in the DIN procedures, SECcurity on-line multi angle light scattering detector SLD7000(B) commercially available from PSS Polymer Standards Service GmbH shall be used for determination of the molecular weight by light scattering.

EXAMPLES

The invention is now explained by means of examples which are intended for illustration only and are not to be considered as limiting the scope of the invention.

Example 1—Paste Preparation—Thermoset

By means of a Kenwood Major Titanium mixer a paste was made by homogenizing the appropriate amounts of the ingredients for the organic vehicle (Table 1), a flake Ag powder (AC-4044 from Metalor Techologies, with a peak maxima according to the above test method of 1.8 μm) or a smaller spherical Ag powder (TZ-A04 from Dowa Electronics Materials CO. LTD. with a peak maxima according to the above test method of 0.3 μm) or a bigger spherical Ag powder (Silver Powder 11000-06 from Ferro Electronic Material Systems, with a peak maxima according to the above test method of 1.5 μm) or mixtures thereof and DCP (dicumyl peroxide from Sigma-Aldrich). The paste was passed through a 3-roll mill Exact 80 E with stainless steel rolls with a first gap of 120 μm and a second gap of 60 μm with progressively decreasing gaps to 20 μm for the first gap and 10 μm for the second gap several times until homogeneity.

TABLE 1

| Constitution of thermosetting system | |
|---|---|
| Component | Proportion of component |
| Dowanol DB [solvent from Dow Chemical] | 54.5 |
| Genomer 3611 [acrylate oligomer from Rahn USA] Crosslinking component | 31.4 |
| Miramer M200 [acrylate monomer from Rahn USA] singly unsaturated compound | 14.1 |

TABLE 2

| Paste Examples | | | | | |
|---|---|---|---|---|---|
| Example | Smaller spherical silver powder [wt. %] | Bigger spherical silver powder [wt. %] | Silver flakes [wt. %] | DCP [wt. %] | Thermo-setting system [wt. %] |
| 1 (Inventive) | 70 | 13 | — | 0.1 | 16.9 |
| 2 (Comparison) | — | — | 83 | 0.1 | 16.9 |
| 3 (Comparison) | 83 | — | — | 0.1 | 16.9 |
| 4 (Comparison) | — | 83 | — | 0.1 | 16.9 |
| 5 (Comparison) | 70 | — | 13 | 0.1 | 16.9 |

Example 2—Solar Cell Preparation and Measurement of Cell Properties

Pastes were applied to mono-crystalline HIT solar cell precursor, available from Roth & Rau AG. The wafers had dimensions of about 156×156 mm$^2$The solar cells used were textured by alkaline etching and had an ITO (indium-tin-oxide) layer on the surface. The example paste was screen-printed onto the texturized ITO-layer using a semi-automatic screen printer X1 SL from Asys Group, EKRA Automatisierungssysteme set with the following screen parameters: 290 mesh, 20 μm wire thickness, 18 μm emulsion over mesh, 72 fingers, 60 μm finger opening, 3 bus bars, 1.5 mm bus bar width. The device with the printed patterns was cured for 10 minutes at 200° C. in an oven after printing.

Analysis of Content of Electrode

The maxima of the diameter distribution of Ag in the electrode were determined according to the test method. As can be seen in Table 3, maxima at about 1.5 μm and about 0.3 μm, were observed for the inventive example.

TABLE 3

| paste performance | | | |
|---|---|---|---|
| Example | Specific line resistivity [μΩ * cm] | Specific contact resistance [mOhm * cm$^2$] | cracking [habitus] |
| 1 (Inventive) | + | + | + |
| 2 (Comparison) | – | – | + |
| 3 (Comparison) | + | ++ | – |
| 4 (Comparison) | –– | – | + |
| 5 (Comparison) | + | 0 | + |

Example 3—Paste Preparation—Thermoplastic

By means of a Kenwood Major Titanium mixer a paste was made by homogenizing the appropriate amounts organic vehicle (Table 4) comprising a thermoplastic polymer (1. polyester: Vitel 2700B from Bostik, Inc.; 2. acrylate: Paraloid B44 from Dow Chemical; 3. phenoxy: PKHH from InChem Corp.) and Butyl carbitol acetate from Sigma Aldrich as an organic solvent and silver particles (Table 5) (a flake Ag powder (AC-4044 from Metalor Techologies, with a peak maxima according to the above test method of 1.8 μm) or a smaller spherical Ag powder (TZ-A04 from Dowa Electronics Materials CO., LTD., with a peak maxima according to the above test method of 0.3 μm) or a bigger spherical Ag powder (Silver Powder 11000-06 from Ferro Electronic Material Systems, with a peak maxima according to the above test method of 1.5 μm) or mixtures thereof).

The paste was passed through a 3-roll mill Exact 80 E with stainless steel rolls with a first gap of 120 μm and a second gap of 60 μm with progressively decreasing gaps to 20 μm for the first gap and 10 μm for the second gap several times until homogeneity.

TABLE 4

Constitution of thermoplastic polymer system.

| Example | Polyester [wt. %] | Acrylate Polymer [wt. %] | Phenoxy Polymer [wt. %] | Butyl carbitol acetate [wt. %] |
|---|---|---|---|---|
| 1 (inventive) | 26 | — | — | 74 |
| 2 (inventive) | — | 26 | — | 74 |
| 3 (inventive) | — | — | 26 | 74 |

TABLE 5

Paste Examples

| Example | Smaller spherical silver powder [wt. %] | Bigger spherical silver powder [wt. %] | Silver flakes [wt. %] | Thermo-plastic polymer system ([wt. %]) | Butyl carbitol acetate [wt. %] |
|---|---|---|---|---|---|
| 1 (inventive) | 70 | 13 | — | Polyester (14) | 3 |
| 2 (inventive) | 70 | 13 | — | Acrylate Polymer (14) | 3 |
| 3 (inventive) | 70 | 13 | — | Phenoxy Polymer (14) | 3 |
| 4 (Comparison) | — | — | 83 | Polyester (14) | 3 |

Example 4—Solar Cell Preparation and Measurement of Cell Properties

Pastes were applied to mono-crystalline HIT solar cell precursor. The wafers had dimensions of 156×156 $mm^2$The solar cells used were textured by alkaline etching and had an ITO (indium-tin-oxide) layer on the surface. The example paste was screen-printed onto the texturized ITO-layer using a semi-automatic screen printer X1 SL from Asys Group, EKRA Automatisierungssysteme set with the following screen parameters: 290 mesh, 20 μm wire thickness, 18 μm emulsion over mesh, 72 fingers, 60 μm finger opening, 3 bus bars, 1.5 mm bus bar width. The device with the printed patterns was cured for 10 minutes at 200° C. in an oven after printing.

Analysis of Content of Electrode

As can be seen in Table 6, all thermoplastic polymer systems applied in combination with micro and nano Ag result in photovoltaic cells with good performance compared to Ag flakes with a bigger diameter.

TABLE 6 paste performance

| Example | Specific line resistivity [μΩ * cm] | Specific contact resistance [mOhm * $cm^2$] |
|---|---|---|
| 1 (Inventive) | + | + |
| 2 (inventive) | 0 | 0 |
| 3 (inventive) | – | – |
| 4 (comparative) | – – | – – |

REFERENCE LIST

101 Front electrodes
102 Optional front layers
103 p-type doped layer
104 n-type doped layer
105 Back electrode
201 Optional front layers, such as indium tin oxide
202 Front doped amorphous layer
203 Front intrinsic amorphous layer
204 Crystalline layer
205 Back intrinsic amorphous layer
206 Back doped amorphous layer
401 Substrate surface
402 Electrode strip
403 Cracks
420 Wafer
421 Cuts
422 Finger lines
601 Area corresponding to Ag
602 Area not corresponding to Ag
801 Peaks in diameter distribution

The invention claimed is:

1. A precursor comprising the following precursor parts:

i) a paste comprising the following paste constituents:

a. Ag particles, and b. a polymer system;

wherein the Ag particles have a multi-modal distribution of particle diameter with at least a first maximum in the range from about 1 nm to about less than 1 μm and at least a further maximum in the range from about 1 μm to about less than 1 mm;

wherein the difference between the first and the further maximum is at least about 0.3 μm;

wherein at least 50 wt. % of the Ag particles with a diameter in the range from 1 μm to 1 mm are spherical; and wherein the ratio of the total weight of Ag particles with a diameter in the range from 1 nm to less than 1 μm to the total weight of Ag particles with a diameter in the range from 1 μm to less than 1 mm is about 1:1 to about 10:1; and ii) a semiconductor substrate.

2. A precursor according to claim 1, wherein the semiconductor substrate is temperature sensitive.

3. A process for the preparation of a device comprising the following steps:

i) providing a precursor according to claim 1; and ii) heating the precursor to obtain the device.

4. A device obtained by the process according to claim 3.

5. A device at least comprising as device parts:

i) a semiconductor substrate; and ii) an electrode comprising Ag particles and a polymer system;

wherein the Ag particles present in the electrode have a multi-modal diameter distribution with at least a first maximum in the range from about 1 nm to about less than 1 μm and at least a further maximum in the range from about 1 μm to about less than 1 mm;

wherein the first maximum and the further maximum are separated by at least about 0.3 μm; and wherein at least 50 wt. % of the Ag particles with a diameter in the range from 1 μm to less than 1 mm are spherical; and wherein the ratio of the total weight of Ag particles with a diameter in the range from 1 nm to less than 1 μm to the total weight of Ag particles with a diameter in the range from 1 μm to less than 1 mm is about 1:1 to about 10:1.

6. A module comprising at least one device according to claim 4 and at least a further device.

7. The precursor according to claim 1, wherein the paste contains not more than about 0.1 wt. % glass based on the total weight of the paste.

8. The precursor according to claim 1, wherein the ratio of the total weight of Ag particles with a diameter in the range from 1 nm to less than 1 μm to the total weight of Ag particles with a diameter in the range from 1 μm to less than 1 mm is about 2:1 to about 8:1.

9. The precursor according to claim 1, wherein the ratio of the total weight of Ag particles with a diameter in the range from 1 nm to less than 1 μm to the total weight of Ag particles with a diameter in the range from 1 μm to less, wherein the ratio of the total weight of Ag particles with a diameter in the range from 1 nm to less than 1 μm to the total weight of Ag particles with a diameter in the range from 1 μm to less than 1 mm is about 3:1 to about 6:1.

10. The process according to claim 3, wherein the heating is conducted at a temperature between about 70° C. and about 250° C.

11. The precursor according to claim 1, wherein the Ag particles have a bimodal diameter distribution.

12. The precursor according to claim 1, wherein the Ag diameter distribution has at least one maximum in the range from about 100 to about 800 nm.

13. The precursor according to claim 1, wherein the Ag diameter distribution has at least one maximum in the range from about 1 to about 10 μm.

14. The precursor according to claim 1, wherein the polymer system is a thermosetting system.

15. The precursor according to claim 14, wherein the thermosetting system comprises a crosslinking compound having at least two unsaturated groups.

16. The precursor according to claim 14, wherein the thermosetting system comprises a radical generator.

17. The precursor according to claim 1, wherein the polymer system is a thermoplastic polymer system, wherein the thermoplastic polymer system comprises a thermoplastic polymer.

18. The precursor according to claim 17, wherein the thermoplastic polymer system comprises a solvent and the solvent is present in the thermoplastic polymer system in an amount of at least 50 wt. %, based on the total weight of the thermoplastic polymer system.

19. The precursor according to claim 1, wherein the ratio of the total weight of Ag particles with a diameter in the range from 1 nm to less than 1 μm to the total weight of Ag particles with a diameter in the range from 1 μm to less than 1 mm is in the range from about 1 to about 9.

20. The precursor according to claim 1, wherein the total weight of Ag particles is in the range from about 60 to about 95 wt. % based on the total weight of the paste.

21. The precursor according to claim 1, wherein the paste contains not more than about 1 wt. % glass based on the total weight of the paste.

* * * * *